US012572718B2

(12) United States Patent

Jia et al.

(10) Patent No.: US 12,572,718 B2
(45) Date of Patent: Mar. 10, 2026

(54) SYSTEM FOR SIMULATING URBAN SPATIAL GROWTH BY COUPLING URBAN DEVELOPMENT WITH WATER RESOURCES ENVIRONMENTAL CARRYING CAPACITY

(71) Applicant: Beijing Univ Civil Engn & Architecture, Beijing (CN)

(72) Inventors: Mengyuan Jia, Beijing (CN); Yuefang Rong, Beijing (CN); Tian Chen, Beijing (CN); Haoxi Lin, Beijing (CN); Haoran Zhang, Beijing (CN); Shanzhi Liu, Beijing (CN)

(73) Assignee: Beijing Univ Civil Engn & Architecture, Beijing (CN)

( * ) Notice: Subject to any disclaimer, the term of this patent is extended or adjusted under 35 U.S.C. 154(b) by 82 days.

(21) Appl. No.: 18/791,693

(22) Filed: Aug. 1, 2024

(65) Prior Publication Data

US 2025/0077736 A1 Mar. 6, 2025

(30) Foreign Application Priority Data

Aug. 29, 2023 (CN) .......................... 202311097307.3

(51) Int. Cl.
 *G06F 30/20* (2020.01)
 *G06Q 50/06* (2024.01)
(52) U.S. Cl.
 CPC ............. *G06F 30/20* (2020.01); *G06Q 50/06* (2013.01)
(58) Field of Classification Search
 CPC ......... G06F 30/20; G06F 30/10; G06Q 50/06; G06Q 50/165; G06Q 50/26; Y02A 20/152
 See application file for complete search history.

(56) References Cited

FOREIGN PATENT DOCUMENTS

| CN | 110889562 A | * | 3/2020 | ............. G06Q 10/04 |
| CN | 111445116 A | * | 7/2020 | ............. G06F 17/18 |
| CN | 112035584 A | * | 12/2020 | ............. G06F 16/29 |

(Continued)

OTHER PUBLICATIONS

Tang W, Lu Z. Application of self-organizing map (SOM)-based approach to explore the relationship between land use and water quality in Deqing County, Taihu Lake Basin. Land Use Policy. Aug. 1, 2022;119:106205. (Year: 2022).*

*Primary Examiner* — Chuen-Meei Gan

(57) ABSTRACT

Provided is a system for simulating urban spatial growth by coupling urban development with water resources environmental carrying capacity, including a dynamic evaluation module for a water resources carrying capacity configured to evaluate and predict a maximum scale of urban space, a identification module for a water ecological sensitive area configured to identify water ecological security patterns and determine spatial regions that need to be avoided during urban spatial growth, and a simulation module for urban land use change configured to predict urban spatial layout features under different water ecological sensitive area protection modes and urban spatial growth scales. The system, as a whole, can predict the trends in urban population, industry, and construction land changes by simulating coupling between water resources environmental carrying capacity as well as water ecological sensitive area protection characteristics and factors such as urban socio-economic development and urban land expansion.

4 Claims, 31 Drawing Sheets

(56)                 References Cited

FOREIGN PATENT DOCUMENTS

| CN | 113065689 | A | * | 7/2021 | ................ C02F 3/32 |
| CN | 116307793 | A | | 6/2023 | |
| CN | 116523415 | A | | 8/2023 | |

* cited by examiner

Module 1: dynamic evaluation module for water resource carrying capacity

Module 2: identification module for water ecological sensitive area

Module 3: simulation module for urban land use change

Legend
Resistance surface evaluation results
Resistance value
High : 4.991
Low : 1.247

Resistance values of rivers

Water ecological corridor

Legend

▨ Water ecological source area
⌇⌇⌇⌇ Water ecological corridor
―――― Other river channel

N

Areas to be avoided during urban
spatial growth
Low security pattern
Relatively low security pattern
Relatively high security pattern
High security pattern
Administrative division boundaries 0　　25　　50km Distance to Haihe River (X1)
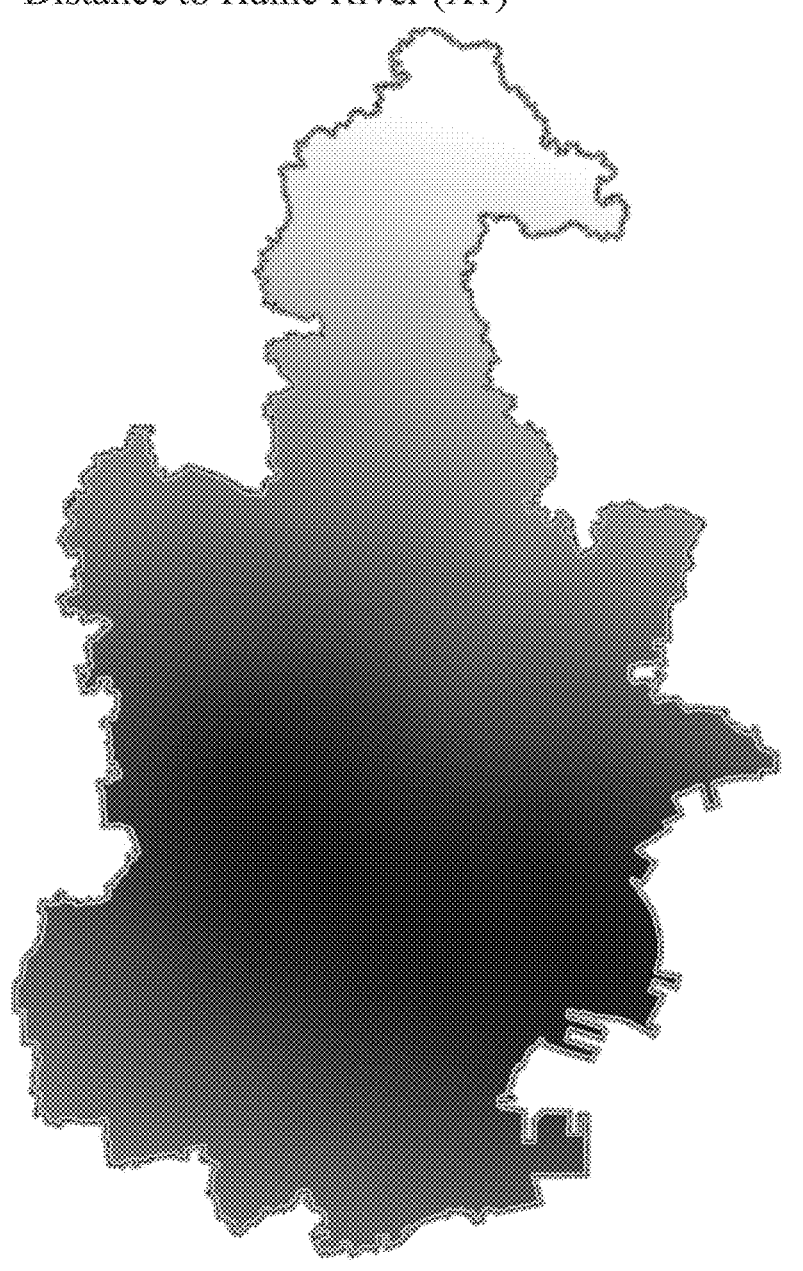
Legend
Value
High : 160154
Low : 0
FIG. 5A

Distance to primary rivers (X2)
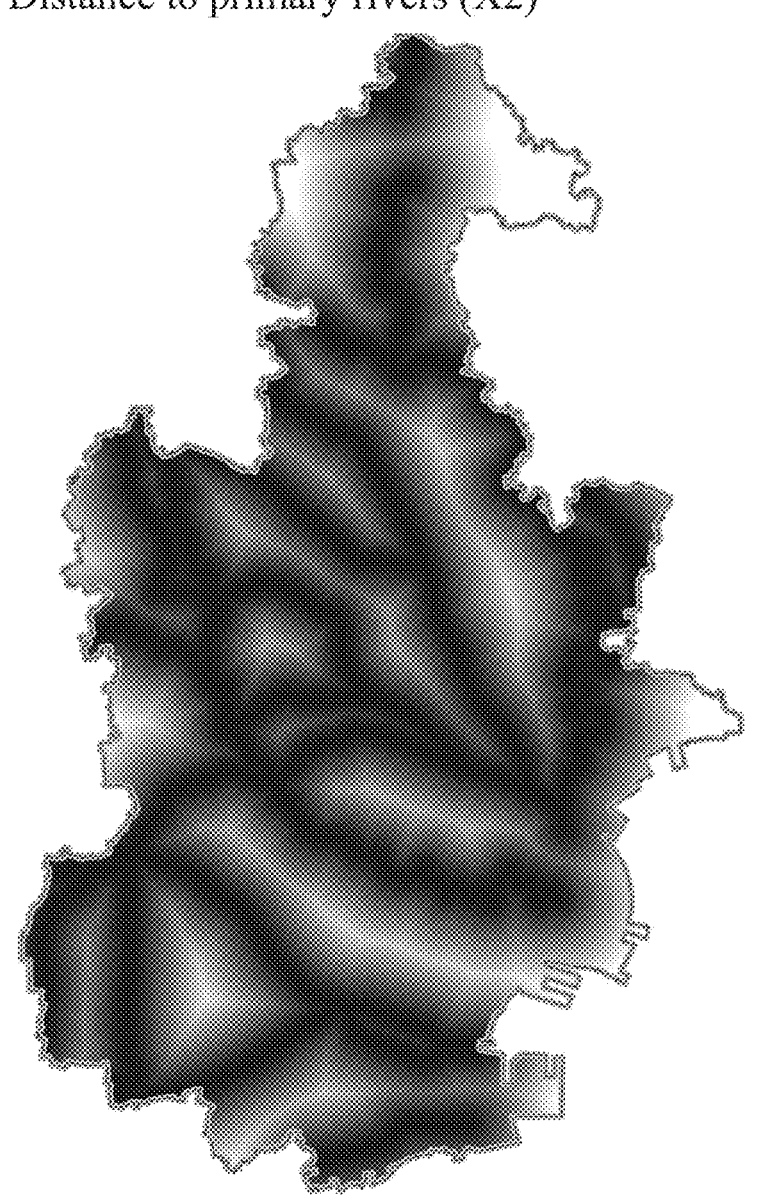
Legend
Value
High : 39530. 4
Low : 0
FIG. 5B

Distance to secondary rivers (X3)

Legend

Value

High : 38335.6

Low : 0

Distance to lakes and reservoirs (X4)

Legend

Value

High : 50319. 1

Low : 0

Whether it is located within a flood storage area (X5)

Legend

Value

☐ 0

■ 1

Distance to water ecological corridors (X6)

Legend

Value

High : 33943.6

Low : 0

Elevation (X7)

Legend

Value

High : 38

Low : 0

Slope (X8)

Legend

Value

High : 64.10

Low : 0

Landform (X9)

Legend

Value

■ 0

▦ 1

☐ 2

Average annual rainfall (X10)

Legend

Value

High : 673

Low : 385

Total population change (X11)

Legend

Value

High : 35

Low : −6

Population density change (X12)

Legend

Value

High : 2611

Low : -3118

GDP total change (X13)

Legend

Value

High : 5947073

Low : -287657

Distance to main center (X14)

Legend

Value

High : 163791

Low : 0

Distance to sub-center (X15)

Legend

Value

High : 53259

Low : 0

Distance to district-level center (X16)

Legend

Value

High : 42893.9

Low : 0

Distance to transportation artery (X17)

Legend

Value
High : 18445. 9
Low : 0

Distance to train station (X18)

Legend

Value

High : 61120.5

Low : 0

Distance to subway station (X19)

Legend

Value

High : 147602

Low : 0

Whether it is planned for construction (X20)

Legend

Value

☐ 0

■ 1

Whether it is located within the planned ecological
protection area (X21)

Legend

Value

☐ 0

■ 1

Whether it is located within the basic farmland
protection area (X22)

Legend

Value

☐ 0

■ 1

Scenario of development with status
quo continued (S1)

■ Urban construction land
▢ Water bodies and
wetlands
▨ Other lands

Scenario prioritizing urban
development (S2)

Urban construction land
Water bodies and
wetlands
Other lands

Scenario prioritizing ecological
protection (S3)

█ Urban construction land
☐ Water bodies and
wetlands
▨ Other lands

Scenario of coordinated urban-
water development (S4)

███ Urban construction land
▢ Water bodies and
wetlands
▒ Other lands

SYSTEM FOR SIMULATING URBAN SPATIAL GROWTH BY COUPLING URBAN DEVELOPMENT WITH WATER RESOURCES ENVIRONMENTAL CARRYING CAPACITY

CROSS REFERENCE TO RELATED APPLICATION

This patent application claims the benefit and priority of Chinese Patent Application No. 202311097307.3, filed with the China National Intellectual Property Administration on Aug. 29, 2023, the disclosure of which is incorporated by reference herein in its entirety as part of the present application.

TECHNICAL FIELD

The present disclosure relates to the technical field of urban and rural planning, and in particular, to a system for simulating urban spatial growth by coupling urban development with water resources environmental carrying capacity.

BACKGROUND

Water is the source of life, an irreplaceable basic natural resource, and a strategic economic resource. "To use water resources as its capacity permits" is an important basis for social and economic development, and spatial growth of towns and cities.

The carrying capacity of water resources and environment has an impact on the urban land scale and spatial layout of urban construction land. Current research either evaluates the population and industrial development levels that the water resource environment can support from an environmental and resource management perspective to determine the upper limit of new urban construction land, or delineate protection areas and ecological redlines by identifying important water ecological spaces such as water sources, rivers, lakes, wetlands, etc. from an ecological security perspective, to determine the ecological bottom line that needs to be avoided during urban development and construction. In fact, under different levels of water resources environmental carrying capacity, sensitive water ecological spaces that need protection are also different. When formulating urban spatial growth management policies, it is necessary to comprehensively evaluate and analyze the scale constraint and spatial constraint effects of the water resource environment.

Therefore, there is an urgent need for a simulation system that can couple water resources environmental carrying capacity with urban spatial growth. This system can simulate the comprehensive impact of water resources environmental carrying capacity on the scale structure and spatial layout of urban spatial growth, as well as coupled mutual feedback between the urban system and the water resource environmental system.

SUMMARY

In view of the above problems, the present disclosure aims to provide a system for simulating urban spatial growth by coupling urban development with water resources environmental carrying capacity. This system simulates urban spatial growth under different urban development and water resource and environmental protection conditions by coupling interactions between water resource supply, water environmental protection, as well as water ecological security and urban population, urban industry, as well as scale and spatial layout of urban land, to assist in delineating urban development boundaries and formulating relevant control policies for urban spatial growth.

To achieve the foregoing objective, the present disclosure adopts the following technical solution: a system for simulating urban spatial growth by coupling urban development with water resources environmental carrying capacity is provided. The simulation system includes:

a dynamic evaluation module for a water resources carrying capacity configured to evaluate and predict a maximum scale of urban space;

an identification module for a water ecological sensitive area configured to identify water ecological security patterns and determine spatial regions that need to be avoided during urban spatial growth; and a simulation module for urban land use change configured to predict urban spatial layout features under different water ecological sensitive area protection modes and urban spatial growth scales.

Further, the dynamic evaluation module for a water resources carrying capacity includes:

a water resource supply sub-module configured to simulate and quantify supply capacity of various conventional and unconventional water resources in a region where a city is located, including variables as follows: annual water supply, supply from other water sources, transferred water supply, and local total water resources;

a water resource demand sub-module configured to simulate and quantify water resource demand of urban and rural areas, including variables as follows: ecological water use, agricultural irrigation water use, rural domestic water use, urban domestic water use, total industrial water use, per capita urban domestic water use, per capita rural domestic water use, and agricultural irrigation water use per hectare;

a water pollution feedback sub-module configured to simulate and quantify a feedback process of improving environmental water quality and reducing pollutant emissions under water pollution pressure, including variables as follows: water pollution pressure, total annual sewage discharge, agricultural wastewater discharge, industrial wastewater discharge, regional gross domestic product, annual water demand, surface runoff pollution pressure, urban construction land area, urbanization rate, urban domestic sewage discharge, and total population;

a water balance feedback sub-module configured to simulate and quantify a feedback process of improving water resource utilization efficiency under water supply pressure, including variables as follows: water supply-demand ratio, annual water demand, annual water supply, supply from other water sources, total population, regional gross domestic product, and urbanization rate; and an urban development sub-module configured to simulate and quantify impact of urban development on water supply-demand balance and water pollution pressure, including variables as follows: annual water demand, rural population, urban population, total population, population growth rate, water supply-demand ratio, GDP growth rate, regional gross domestic product, water consumption per 10,000-yuan GDP, urbanization growth rate, urbanization rate, water pollution pressure, and urban construction land area.

Further, the identification module for a water ecological sensitive area includes:

a water ecological security pattern construction sub-module configured to form a spatial pattern composed of local areas, points, and spatial relationships that play a key role in maintaining ecological security; and a water ecological sensitive area identification sub-module configured to extract important spatial regions that protect the health of water ecological environments.

Further, the identification module for a water ecological sensitive area requires the following data:

1) a boundary vector map of a study area;

2) vector maps of river systems, highways, and railways;

3) digital elevation model (DEM) raster data at 100 m resolution;

4) annual normalized difference vegetation index (NDVI) raster data at 100 m resolution;

5) land use type raster data at 100 m resolution; and 6) overall urban planning and statistical yearbook data for the study area.

Further, the identification module for a water ecological sensitive area is specifically configured to establish spatial data layers of water ecological source areas, evaluate resistance surfaces to obtain resistance surface data layers, extract water ecological corridors to obtain water ecological corridor data layers, and divide importance levels of the water ecological security patterns, which is specifically configured to:

1) identify a spatial range of water ecological source areas and establishing spatial data layers of the water ecological source areas;

2) evaluate resistance surfaces, to obtain resistance surface data layers through various surface data types;

3) extract water ecological corridors, and delineate a water ecological corridor on a river channel and within a range of 100 m-300 m on both sides based on resistance values of each river segment; and 4) divide importance levels of the water ecological security patterns: divide the resistance surface data layers using a natural breakpoint method and identifying spatial regions that need to be avoided during urban spatial growth.

Further, the simulation module for urban land use change is specifically configured to:

an urban land use change simulation model sub-module configured to establish a simulation model for urban land use changes based on historical land use change patterns; and an urban land use change scenario simulation sub-module configured to simulate and predict urban land use changes under different scenarios of water resources environmental protection and development, to generate simulation results for urban spatial growth coupled with water resources environmental carrying capacity.

Further, the simulation module for urban land use change requires the following data:

1) historical land use raster data at 100 m resolution, containing data of two historical years ($Y_1$, $Y_2$), with an interval of over 5 years, where land use types include urban construction land, water bodies and wetlands, and other lands;

2) vector maps of river systems, highways, and railways;

3) digital elevation model (DEM) raster data at 100 m resolution;

4) annual average rainfall raster data of the same year as the historical land use raster data;

5) permanent population and GDP statistical data of the same year as the historical land use raster data;

6) vector maps of ecological corridors, urban main centers, urban sub-centers, district-level centers; and 7) vector maps of flood storage areas, ecological protection redlines, basic farmland protection redlines, and urban development boundaries.

Further, the simulation module for urban land use change is specifically configured to:

1) name data layers and assign values to grid cells based on data material categories to obtain driving factor layers for urban land use changes;

2) calculate spatial autocorrelation factors (Autocov) using the following formula:

$$Autocov_i = \frac{\sum_{i \neq j} w_{ij} y_j}{\sum_{i \neq j} w_{ij}}$$

where $y_j$ represents a land use state of grid cell j, assigned with values of 1 and 0; W$ij$ represents a spatial weight between grid cell i and grid cell j, determined using inverse distance weighting, with a specific calculation method as follows:

$$W_{ij} = \begin{cases} \dfrac{1}{D_{ij}}, & \text{when } D_{ij} < 300 \\ 0, & \text{when } D_{ij} \geq 300 \end{cases}$$

where $D_{ij}$ represents a Euclidean distance between grid cell i and grid cell j;

3) perform a multicollinearity test on driving factors;

4) reclassify the historical land use raster data;

5) run R language programs; and 6) output simulation results.

Further, in 3), factors with multicollinearity are eliminated using a kappa coefficient and a variance inflation factor (VIF); factors pass the multicollinearity test when the kappa coefficient is less than 100 and the VIF is less than 10.

Further, in 4), water bodies and wetlands are assigned with a value of 3, urban construction land is assigned with a value of 2, and other land types are assigned with a value of 1.

The present disclosure achieves the following beneficial effects: the system, as a whole, can predict the trends in urban population, industry, and construction land changes by simulating coupling between water resources environmental carrying capacity as well as water ecological sensitive area protection characteristics and factors such as urban socio-economic development and urban land expansion, to assist in delineating urban development boundaries and formulating relevant urban spatial growth control policies, providing a new approach for coupled simulation of interaction between urban artificial environments and natural environments.

DETAILED DESCRIPTION OF THE EMBODIMENTS

Figure 1:
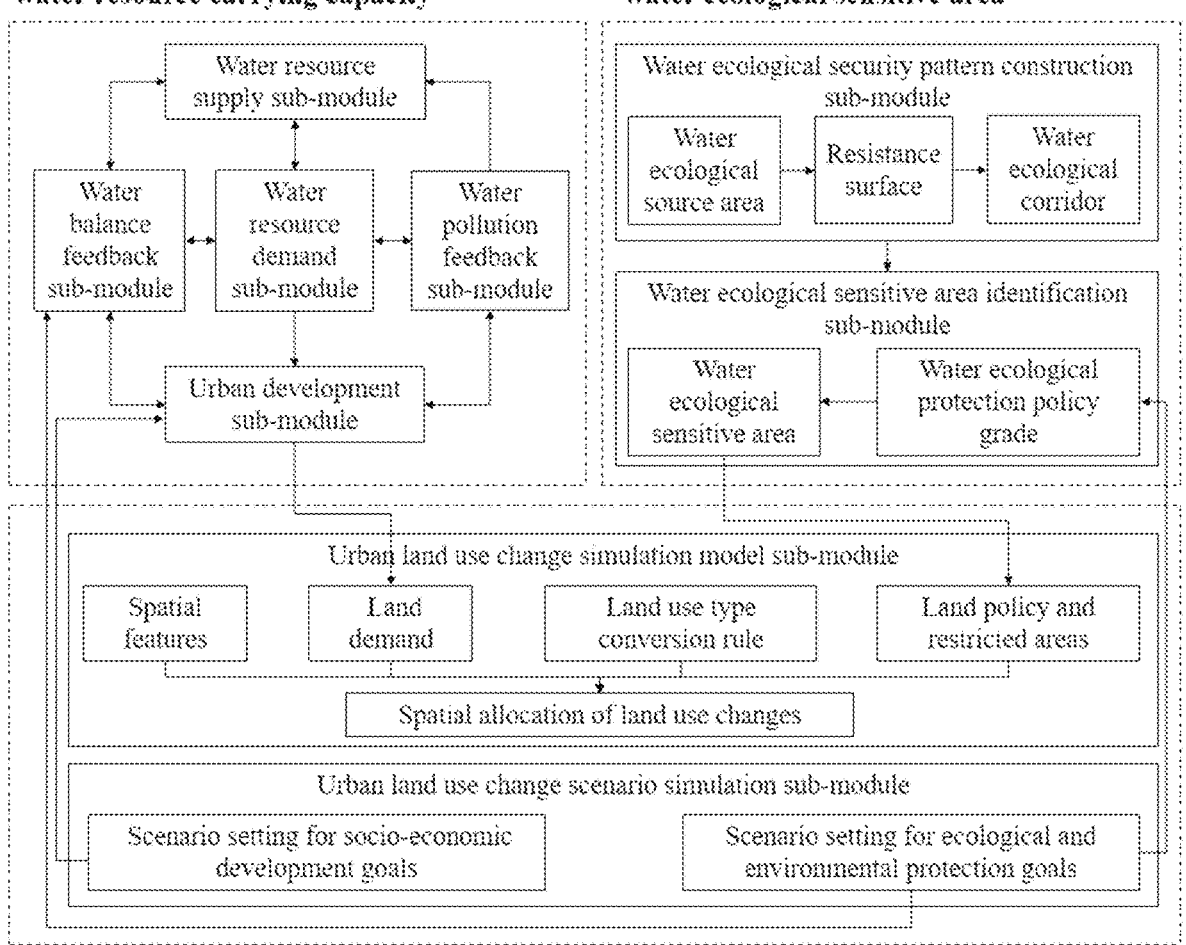
FIG. 1 is a logic framework diagram of a system for simulating urban spatial growth by coupling urban development with water resources environmental carrying capacity according to the present disclosure.

In order to enable those of ordinary skill in the art to better understand the technical solution of the present disclosure, the technical solution of the present disclosure will be further described in the following with reference to the accompanying drawings and embodiments.

Referring to a system for simulating urban spatial growth by coupling urban development with water resources environmental carrying capacity shown in FIG. 1 to FIGS. 6A-6D, the simulation system includes three system modules: a dynamic evaluation module for a water resources carrying capacity, an identification module for a water ecological sensitive area, and a simulation module for urban land use change.

Module 1: The dynamic evaluation module for a water resources carrying capacity can evaluate and predict a maximum scale of urban space during a planning period based on local water resource conditions of a city, future socio-economic development goals of the city, water resource management goals, and other factors.

The dynamic evaluation module for a water resources carrying capacity consists of five parts: a water resource supply sub-module, a water resource demand sub-module, a water pollution feedback sub-module, a water balance feedback sub-module, and an urban development sub-module.

The water resource supply sub-module is configured to simulate and quantify supply capacity of various conventional and unconventional water resources in a region where the city is located, including variables as follows: annual water supply (WS), supply from other water sources (QTS), transferred water supply (OWS), and local total water resources (NWS).

The water resource demand sub-module is configured to simulate and quantify water resource demand of urban and rural areas, including variables as follows: ecological water use (ECOWR), agricultural irrigation water use (AGRWR), rural domestic water use (RURWR), urban domestic water use (URBWR), total industrial water use (INDWR), per capita urban domestic water use (UWPP), per capita rural domestic water use (RWPP), and agricultural irrigation water use per hectare (AGRWP).

The water pollution feedback sub-module is configured to simulate and quantify a feedback process of improving environmental water quality and reducing pollutant emissions under water pollution pressure, including variables as follows: water pollution pressure (WP), total annual sewage discharge (TOTWP), agricultural wastewater discharge (AGRWW), industrial wastewater discharge (INDWW), regional gross domestic product (GDP), annual water demand (WR), surface runoff pollution pressure (DBJLWP), urban construction land area (UBA), urbanization rate (UR), urban domestic sewage discharge (URBWW), and total population (POP).

The water balance feedback sub-module is configured to simulate and quantify a feedback process of improving water resource utilization efficiency under water supply pressure, including variables as follows: water supply-demand ratio (WSWR), annual water demand (WR), annual water supply (WS), supply from other water sources (QTSR), total population (POP), regional gross domestic product (GDP), and urbanization rate (UR).

The urban development sub-module is configured to simulate and quantify impact of urban development on water supply-demand balance and water pollution pressure, including variables as follows: annual water demand (WR), rural population (RPOP), urban population (UPOP), total population (POP), population growth rate (POPR), water supply-demand ratio (WSWR), GDP growth rate (GDPR), regional gross domestic product (GDP), water consumption per 10,000-yuan GDP (INDWP), urbanization growth rate (URR), urbanization rate (UR), water pollution pressure (WP), urban construction land area (CUBA).

Table 1 shows a list of variables of the dynamic evaluation module for a water resources carrying capacity:

TABLE 1

| Variables of dynamic evaluation module for a water resources carrying capacity | | | |
|---|---|---|---|
| Variable type | Explanations | Variable | Abbreviation |
| State variables | State variables, also known as accumulation variables, are the variables that ultimately determine the behavior of the system. As time progresses, a value at a current moment is equal to a value at a previous moment plus a variation over that a period from the previous moment to the current moment. | 1 Total population (in 10,000 people) | POP |
| | | 2 Urbanization rate (%) | UR |
| | | 3 Regional gross domestic product (in 100 million yuan) | GDP |
| | | 4 Urban construction land area (in square kilometers) | UBA |
| | | 5 Supply from other water sources (in 10,000 tons) | QTS |
| | | 6 Irrigated farmland area (in square kilometers) | AGR |

TABLE 1-continued

Variables of dynamic evaluation module for a water resources carrying capacity

| Variable type | Explanations | | Variable | Abbreviation |
|---|---|---|---|---|
| Rate variables | Rate variables directly change values of the accumulation variables, reflecting the speed of input or output of the accumulation variables. In essence, rate variables are no different from auxiliary variables. | 7 | Population variation (in 10,000 people) | CPOP |
| | | 8 | Urbanization growth (%) | CUR |
| | | 9 | GDP growth (in 100 million yuan) | CGDP |
| | | 10 | Urban construction land variation (in square kilometers) | CUBA |
| | | 11 | Growth of supply from other water sources (in 10,000 tons) | CQTS |
| Auxiliary variables | Auxiliary variables are values calculated from other variables | 12 | Annual water demand (in 10,000 tons) | WR |
| Auxiliary variables | within the system, and their values at the current moment are relatively independent of historical values. | 13 | Annual water supply (in 10,000 tons) | WS |
| | | 14 | Water supply-demand ratio | WSWR |
| | | 15 | Annual total wastewater discharge (in 10,000 tons) | TOTWP |
| | | 16 | Water pollution pressure | WP |
| | | 17 | Agricultural irrigation water use (in 10,000 tons) | AGRWR |
| | | 18 | Rural domestic water use (in 10,000 tons) | RURWR |
| | | 19 | Urban domestic water use (in 10,000 tons) | URBWR |
| | | 20 | Total industrial water use (in 10,000 tons) | INDWR |
| | | 21 | Water consumption per 10,000-yuan GDP (in cubic meters/10,000 yuan) | INDWP |
| | | 22 | Urban population (in 10,000 people) | UPOP |
| | | 23 | Rural population (in 10,000 people) | RPOP |
| | | 24 | Urban domestic sewage discharge (in 10,000 tons) | URBWW |
| | | 25 | Urban domestic wastewater treatment rate (%) | URBWWP |
| | | 26 | Industrial wastewater discharge (in 10,000 tons) | INDWW |
| | | 27 | Agricultural wastewater discharge (in 10,000 tons) | AGRWW |
| | | 28 | Surface runoff pollution pressure | DBJLWP |
| | | 29 | GDP growth rate | GDPR |
| | | 30 | Urbanization growth rate | URR |
| | | 31 | Population growth rate | POPR |
| | | 32 | Growth rate of supply from other water sources | QTSR |
| Constants | Constants values do not change over time. | 33 | per capita urban domestic water use (in cubic meters/person/day) | UWPP |
| | | 34 | per capita rural domestic water use (in cubic meters/person/day) | RWPP |
| | | 35 | agricultural irrigation water use per hectare (in 10,000 tons/hectare) | AGRWP |
| | | 36 | Total urban area (in square kilometers) | AREA |

TABLE 1-continued

Variables of dynamic evaluation module for a water resources carrying capacity

| Variable type | Explanations | | Variable | Abbreviation |
|---|---|---|---|---|
| | | 37 | Urban construction land area growth rate | CUBAR |
| | | 38 | Agricultural irrigation wastewater discharge coefficient | AGRWWR |
| | | 39 | Urban domestic water consumption coefficient | URBWWR |
| | | 40 | Total local water resources (in 10,000 tons) | NWS |
| Exogenous variables | Exogenous variables change over time, but this change is not caused by other variables within the system. | 41 | Land acquisition area (in 1,000 hectares) | CAGR |
| | | 42 | Ecological water use(in 10,000 tons) | ECOWR |
| | | 43 | Industrial wastewater discharge coefficient | INDWWR |
| | | 44 | Transferred water supply (in 10,000 tons) | OWS |

The detailed setup of the dynamic evaluation module for a water resources carrying capacity using case data is as follows:

1) INITIAL TIME=2010 (Simulation start time)
Units: Year
2) FINAL TIME=2025 (Simulation end time)
Units: Year
3) SAVEPER=1 (Result storage time interval)
Units: Year
4) TIME STEP=1 (Simulation time step)
Units: Year
5) AGR=INTEG (CAGR, 353.2)
Units: 1,000 hectares
6) AGRWP=0.357
Units: 10,000 tons/hectare
7) AGRWR=AGRWP*AGR*1000
Units: 10,000 tons
8) AGRWW=AGRWR*AGRWWR
Units: 100 million cubic meters
9) AGRWWR=0.3
Units: undefined
10) AREA=11917
Units: square kilometers
11) CAGR=AGRLANDTable (Time)
Units: 1,000 hectares
12) AGRLANDTable ([(2000,−30)-(2025,2), (2000,1), (2001,1.1), (2002,0.1), (2003,−0.3), (2004,−0.7), (2005,1.8), (2006,−5.6), (2007,−0.3), (2008,−1.3), (2009,−0.4), (2010,−3), (2011,−6.6), (20 12,−1), (2013,−28.1), (2014,0), (2015,0), (2016,−2.3), (2017, 0), (2018,−1.9), (2025,−0.5)], (2000,1), (20 01,1.1), (2002,0.1), (2003,−0.3), (2004,−0.7), (2005,1.8), (2006,−5.6), (2007,−0.3), (2008,−1.3), (2009,−0.4), (2010,−3), (2011,−6.6), (2012,−1), (2013,−28.1), (2014,0), (2015,0), (2016,−2.3), (2017,0), (2018,−1.9), (2025,−0.5))
Units: 1,000 hectares
13) CGDP=GDP*GDPR
Units: 100 million yuan
14) CPOP=POP*POPR
Units: 10,000
15) CQTS-QTS*QTSR
Units: 10,000 tons 16) CUBA=UBA*UBAR
Units: square kilometers
17) CUR=UR*URR
Units: undefined
18) DBJLWP=UBA/AREA
Units: undefined
19) ECOWR=ECOWRTable (Time)*10000
Units: 10,000 tons
20) ECOWRTable ([(2010,0)-(2025, 10)], (2010, 1.22), (2011,1.1), (2012,1.4), (2013,1.9), (2014,2.1), (2015, 2.9), (2016,4.1), (2017,5.2), (2018,5.6), (2025,10))
Units: 100 million cubic meters
21) GDP=INTEG (CGDP, 9224)
Units: 100 million yuan
22) GDPR=IF THEN ELSE (WP<0.14: AND: WSWR>1, 0.3779-1.944e-05*GDP, 0.3779-1.944e-05*GDP* discount factor)
Units: **undefined*
23) INDWP=10.44-0.0002896*GDP-5.16504*SIND
Units: 10,000 tons/10,000 yuan
24) INDWR=GDP*INDWP
Units: 10,000 tons
25) INDWTable( [(2010,0)-(2025,0.5)], (2010,0.41), (2011,0.412), (2012, 0.375), (2013,0.346), (2014,0.352), (2015,0.358), (2016, 0.328), (2017,0.329), (2018,0.32), (2025,0.28))
Units: 10,000 tons
26) INDWWR=INDWTable (Time)
Units: undefined
27) INDWW=INDWR*INDWWR
Units: 100 million cubic meters
28) NWS=100000
Units: 10,000 tons
29) OWS=WDSTable (Time)*10000
Units: 10,000 tons
30) POP=INTEG (CPOP, 1299.29)
Units: 10,000 people
31) POPR=IF THEN ELSE (WP<0.14: AND:WSWR>1, 0.0271, 0.0271* discount factor)
Units: undefined
32) QTS=INTEG (CQTS,3900)
Units: 10,000 tons 33) QTSR=IF THEN ELSE (WSWR>1, QTSRTable(Time), QTSRTable(Time)*1.1)

Units: %

QTSRTable=
[(2009,0)-(2025,3)],(2009,1.6),(2010,0.3077),(2011, 2.2276),(2012,0.1945), (2025,0.1 945)

Units: %

35) RPOP=POP-UPOP

Units: 10,000

36) RURWR=RPOP*RWPP

Units: 10,000 tons

37) RWPP=74*365/1000

Units: tons/(people*years)

38) TOTWP=AGRWW+URBWW* (1-URBWWP)+IN-DWW

Units: 10,000 tons

39) UBA=INTEG (CUBA, 686.71)

Units: square kilometers

40) UBAPP=(UBA*le+06)/(UPOP*10000)

Units: square meters/person

41) UBAR=0.05

Units: undefined

42) UPOP=POP*UR/100

Units: 10,000 people

43) UR=INTEG (CUR, 79.55)

Units: %

44) URBWR=UPOP*UWPP

Units: 10,000 tons

45) URBWW=URBWR* (1-URBWWR)

Units: 100 million cubic meters

46) URBWWP=MIN ((31.35+0.0005279*GDP+0.8042*UR)/100, 1)

Units: undefined

47) URBWWR=0.8

Units: undefined

48) URR=IF THEN ELSE(WP<0.14: AND:WSWR>1, 0.0071, 0.0071* discount factor)

Units: undefined

49) UWPP=114*365/1000

Units: tons/person/year

50) WDSTable
([[(2000,0)-(2025,20)], (2000,5.2), (2010,8.06), (2011,7.96), (2012,4.39), (2013, 5.45), (2014,9.5), (2015,8.5), (2016, 10.8), (2018,14.3), (2025,20))

Units: 10,000 tons

51) WP=(TOTWP/WR)*0.5+DBJLWP*0.5

Units: undefined

52) WR=AGRWR+RURWR+URBWR+INDWR+ECOWR

Units: 10,000 tons

53) WS=OWS+NWS+QTS

Units: 100 million cubic meters

54) WSWR=WS/WR

Units: undefined

After data is input and the dynamic evaluation module for a water resources carrying capacity is run, the annual urban construction land area of each year can be obtained, and a land demand matrix named demand.txt is established, with the format as shown in Table 2. The first to fourth columns represent the year of prediction, other land areas, urban construction land area, and water body and wetland area, respectively. The value of the urban construction land area is the value of the urban construction land (UBA) outputted by sub-module 1, while the value of the water body and wetland area can be set based on the simulation scenario.

TABLE 2

| Example of Land Demand Matrix | | | |
|---|---|---|---|
| | 1 | 2 | 3 |
| 2000 | 1490007 | 227437 | 287191 |
| 2001 | 1477151 | 238512 | 288972 |
| 2002 | 1464295 | 249588 | 290752 |
| 2003 | 1451440 | 260662 | 292533 |
| 2004 | 1438584 | 271738 | 294313 |
| 2005 | 1425728 | 282813 | 296094 |
| 2006 | 1412872 | 293888 | 297875 |
| 2007 | 1400016 | 304964 | 299655 |
| 2008 | 1387161 | 316038 | 301436 |
| 2009 | 1374305 | 327114 | 303216 |
| 2010 | 1361449 | 338189 | 304997 |
| 2011 | 1348593 | 349264 | 306778 |
| 2012 | 1335737 | 360340 | 308558 |
| 2013 | 1322882 | 371414 | 310339 |
| 2014 | 1310026 | 382490 | 312119 |
| 2015 | 1297170 | 393565 | 313900 |
| 2016 | 1284314 | 404640 | 315681 |
| 2017 | 1271458 | 415716 | 317461 |
| 2018 | 1258603 | 426790 | 319242 |

Module 2: the identification module for a water ecological sensitive area includes:

a water ecological security pattern construction sub-module configured to form a spatial pattern composed of local areas, points, and spatial relationships that play a key role in maintaining ecological security; and a water ecological sensitive area identification sub-module configured to extract important spatial regions that protect the health of water ecological environments.

The following data materials need to be prepared for the identification module for a water ecological sensitive area:

1) a boundary vector map of a study area;
2) vector maps of river systems, highways, and railways;
3) digital elevation model (DEM) raster data at 100 m resolution;
4) annual normalized difference vegetation index (NDVI) raster data at 100 m resolution;
5) land use type raster data at 100 m resolution; and
6) overall urban planning and statistical yearbook data for the study area.

Module 2 is specifically configured to implement the following three steps:

Step 1: Identify a spatial range of water ecological source areas based on the table below, where identification objects include water resource protection source areas, hydrological regulation source areas, biological habitat source areas, and cultural protection source areas, and create spatial data layers of the water ecological source areas (in shapefile format) in the ArcGIS platform, as shown in Table 3.

TABLE 3

| Identification Objects of Water Ecological Source Areas | |
|---|---|
| Source area type | Identification objects |
| Water resource protection source areas | Surface water source protection areas and surrounding buffer zones |
| | Water conservation zones |
| | Groundwater recharge zones and protection zones |
| Hydrological regulation source areas | Important rivers |
| | Important lakes, reservoirs, and wetlands |
| Biological habitat source areas | Soil erosion sensitive areas |
| | Aquatic biological habitats |
| Cultural protection source areas | Important water cultural heritage protection areas |

Figure 2:
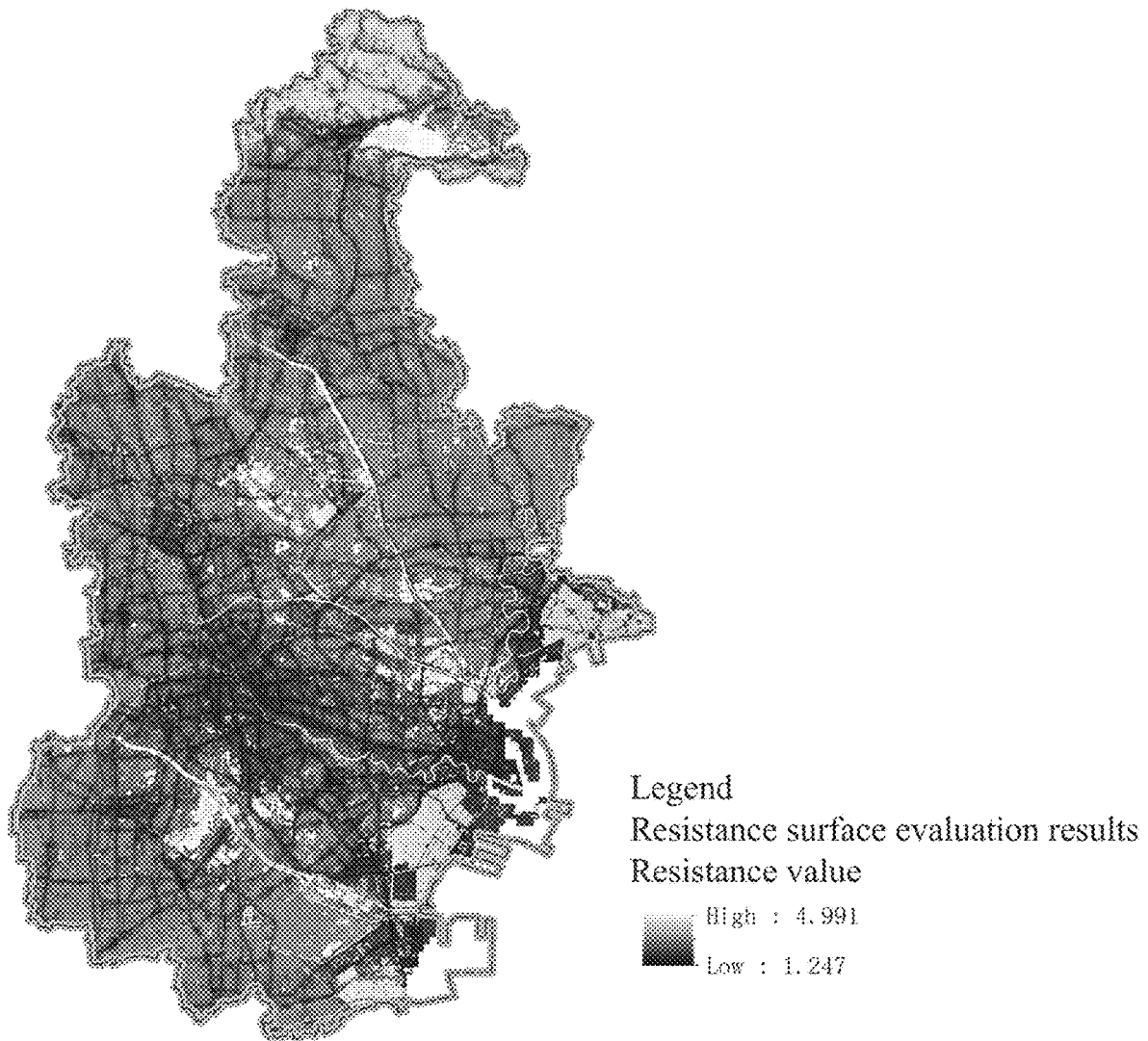
FIG. 2 illustrates an example of resistance surface evaluation results according to an embodiment of the present disclosure.

Step 2: Evaluate resistance surfaces. Digital elevation model (DEM) data, land cover type data, normalized difference vegetation index (NDVI) data, and vector maps of roads and railways in the study area are collected. Values are assigned and weighted calculations are performed in the ArcGIS platform based on the resistance value evaluation indicators in Table 4. Each indicator is a raster format layer. Weighted calculations are performed using a raster calculator tool of ArcGIS, to obtain resistance surface data layers (in raster format). Resistance surface evaluation results are as shown in FIG. 2.

TABLE 4

Resistance value evaluation indices, assigned values, and weights

| Evaluation factors | Primary index | Secondary index | Graded value assignment | Weight |
|---|---|---|---|---|
| Topography and geomorphology | Altitude | <200 m | 5 | 0.007 |
| | | 200 m-500 m | 3 | |
| | | >500 m | 1 | |
| | Slope | <10 degrees | 5 | 0.062 |
| | | 10-20 degrees | 4 | |
| | | 20-30 degrees | 3 | |
| | | 30-40 degrees | 2 | |
| | | >40 degrees | 1 | |
| Surface cover type | Urban construction land, unutilized land | | 1 | 0.538 |
| | Cultivated land, garden land | | 2 | |
| | Grassland | | 3 | |
| | Forest land | | 4 | |
| | Water area, wetland | | 5 | |
| Vegetation coverage | NDVI index | Divided into 5 grades based on the natural breakpoint method | Assigned with values of 5 to 1, where a higher NDVI value corresponds to a greater assigned value | 0.134 |
| Road infrastructure | Distance to highway (national highway, provincial highway, county highway, township highway) | <100 m | 1 | 0.171 |
| | | 100-200 m | 2 | |
| | | 200-500 m | 3 | |
| | | 500-1000 m | 4 | |
| | | >1000 m | 5 | |
| | Distance to railroad | <100 m | 1 | 0.023 |
| | | 100-200 m | 2 | |
| | | 200-500 m | 3 | |
| | | 500-1000 m | 4 | |
| | | >1000 m | 5 | |
| Spatial distance | Distance to water ecological source area | Divided into 5 grades based on the natural breakpoint | Assigned with values of 5 to 1, where a shorter distance corresponds to a greater assigned value | 0.066 |

Figure 3A:
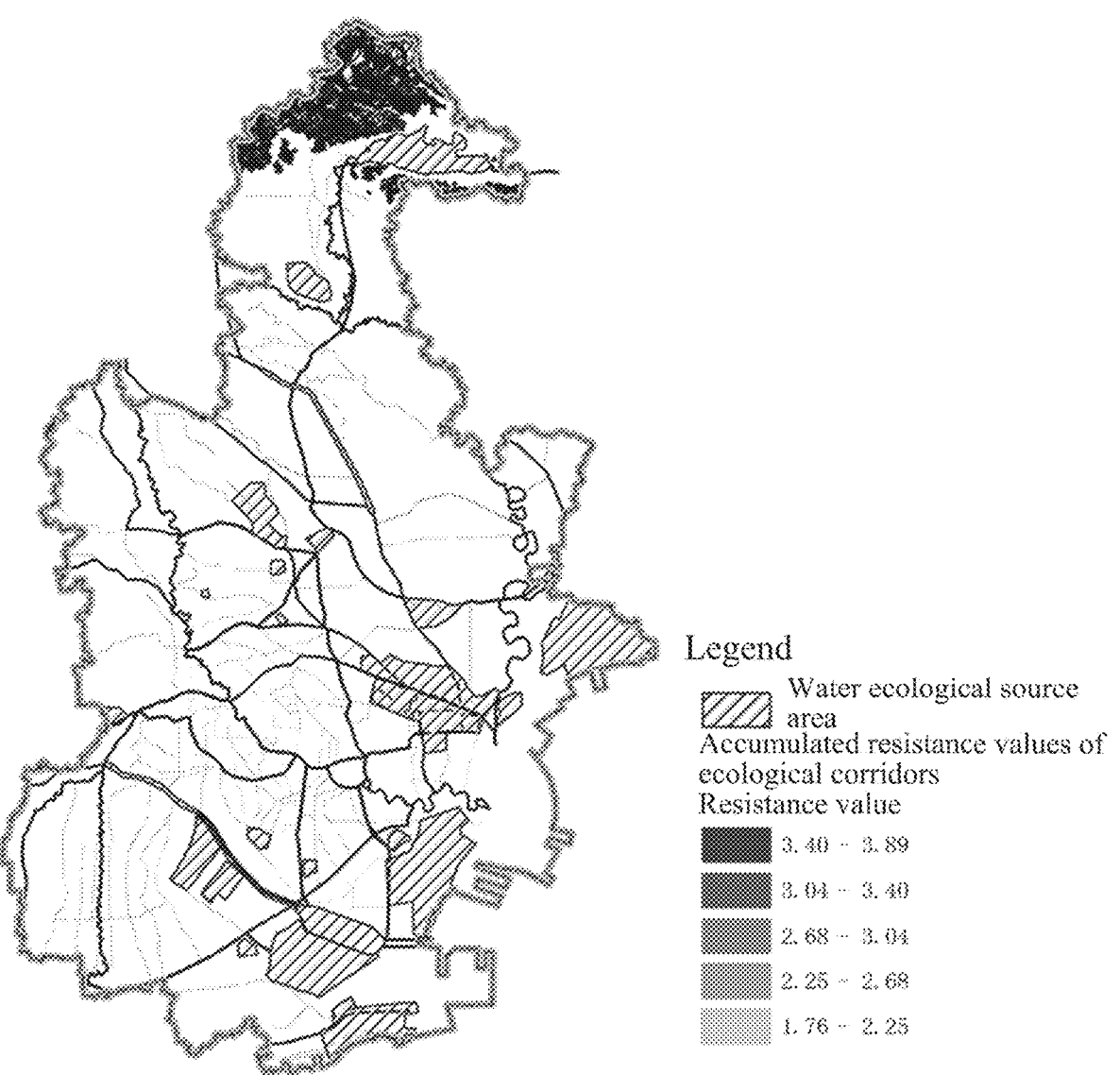
FIGS. 3A-3B illustrate examples of water ecological corridor extraction results according to an embodiment of the present disclosure.
Figure 3B:
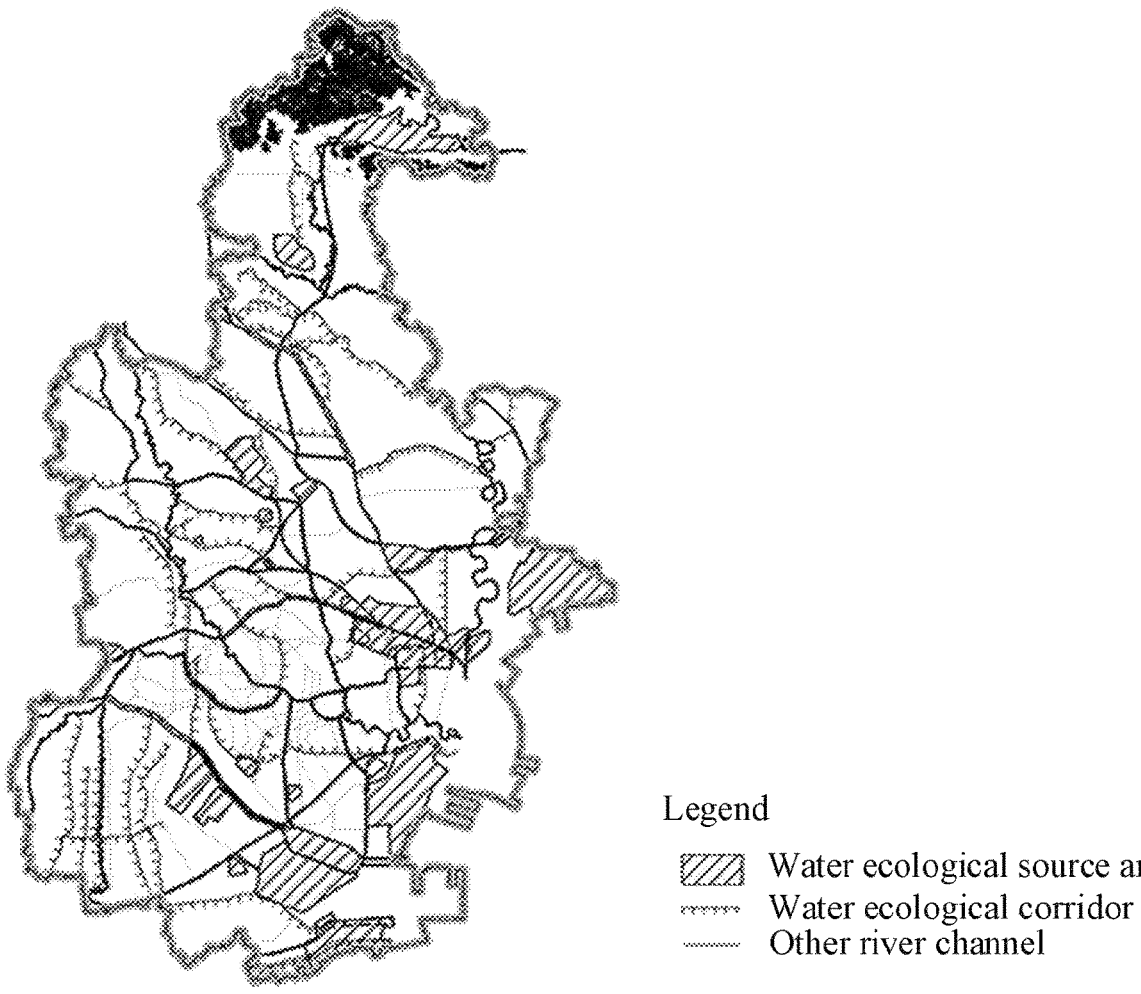

Step 3: Extract water ecological corridors. Using a vector layer of river water systems in the ArcGIS platform, a sum of resistance surface grid cell values crossed by each river segment is calculated to obtain a resistance value of each river segment. A higher value indicates a lower spatial resistance, making it more conducive to forming ecological corridors between source areas. Based on the principle of at least one ecological corridor between two water ecological source areas, a river network selection line is determined, then a river channel and a range of approximately 100-300 m on both sides are delineated as a water ecological corridor. The extraction results of water ecological corridors are as shown in FIGS. 3A-3B.

Figure 4:
FIG. 4 illustrates an example of importance levels of water ecological security patterns and regions that need to be avoided during urban spatial growth according to an embodiment of the present disclosure.

Step 4: Divide importance levels of the water ecological security patterns. In the ArcGIS platform, based on the natural breakpoint method, the resistance surface data layers are divided into four layers: low security level, relatively low security level, relatively high security level, and high security level. Subsequently, the water ecological source area layers and the water ecological corridor layers are overlaid with the high security level, to serve as the spatial regions that need to be avoided during urban spatial growth identified by Module 2, and the identified spatial regions are outputted as a mask.shp file. Examples of the importance levels of the water ecological security patterns and the regions that need to be avoided during urban spatial growth are shown in FIG. 4.

Module 3: the simulation module for urban land use change includes:

an urban land use change simulation model sub-module configured to establish a simulation model for urban land use changes based on historical land use change patterns; and an urban land use change scenario simulation sub-module configured to simulate and predict urban land use changes under different scenarios of water resources environmental protection and development, to generate simulation results for urban spatial growth coupled with water resources environmental carrying capacity.

The following data materials need to be prepared for Module 3:

1) historical land use raster data at 100 m resolution, containing data of two historical years $(Y_1, Y_2)$, with an interval of over 5 years, where land use types include urban construction land, water bodies and wetlands, and other lands;

2) vector maps of river systems, highways, and railways;

3) digital elevation model (DEM) raster data at 100 m resolution;

4) annual average rainfall raster data of the same year as the historical land use raster data;

5) permanent population and GDP statistical data of the same year as the historical land use raster data;

6) vector maps of ecological corridors, urban main centers, urban sub-centers, district-level centers; and 6) vector maps of flood storage areas, ecological protection redlines, basic farmland protection redlines, and urban development boundaries.

Figure 5C:
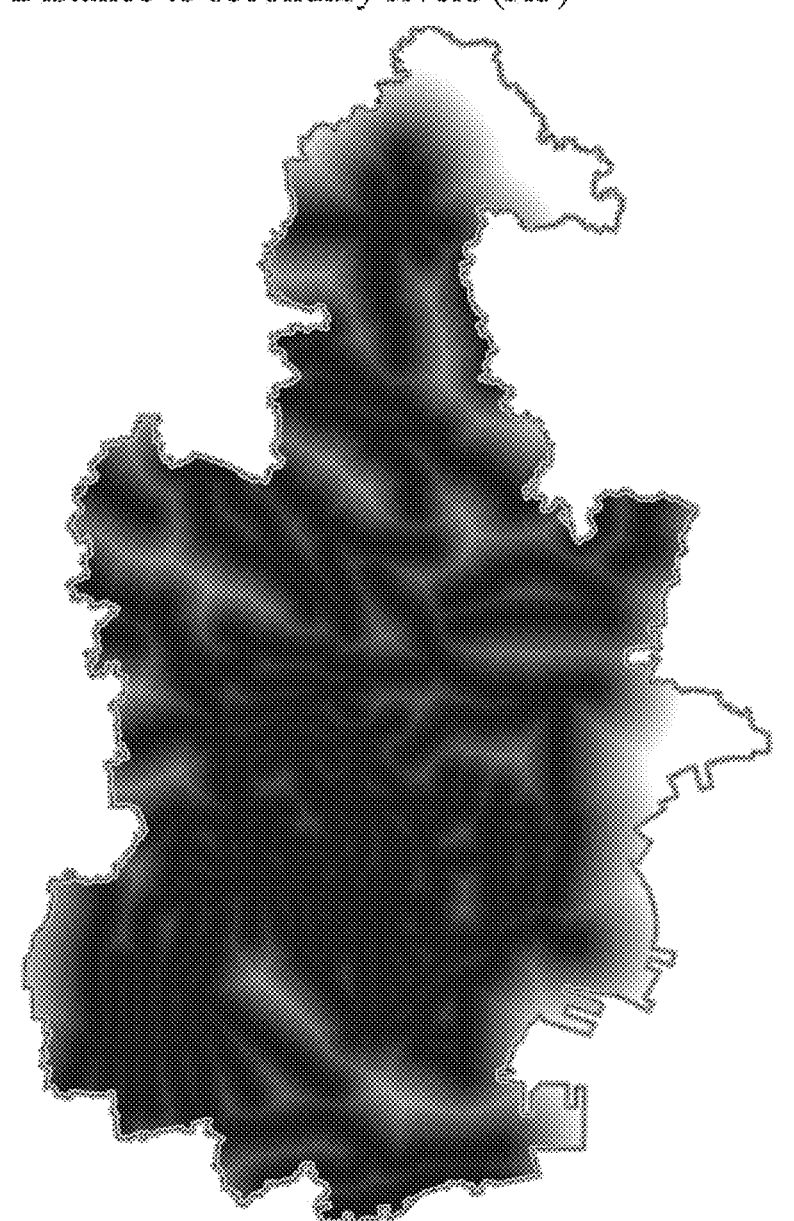
FIGS. 5A-5V illustrate exemplary datas of driving factor layers according to an embodiment of the present disclosure.
Figure 5D:
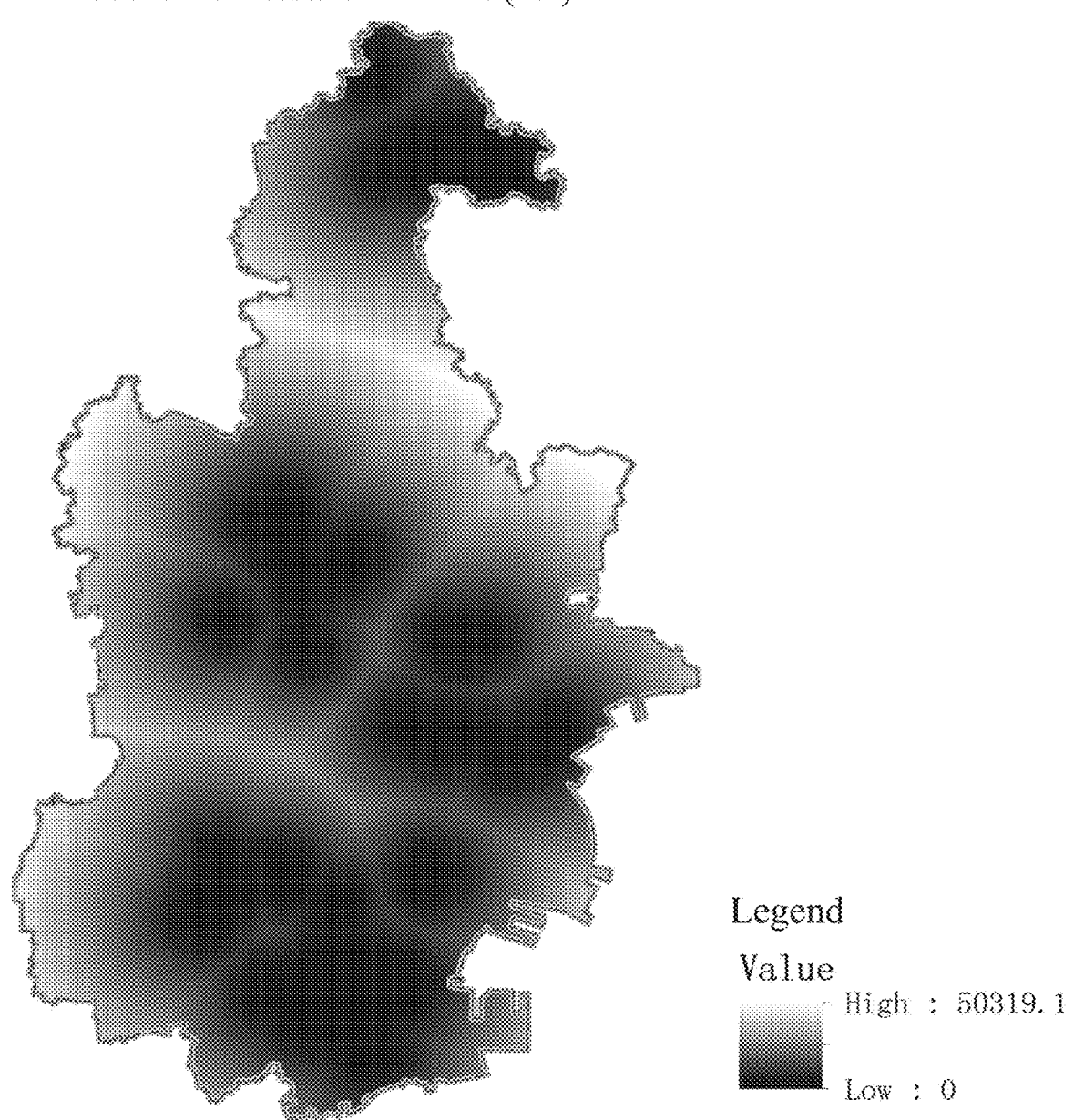
Figure 5E:
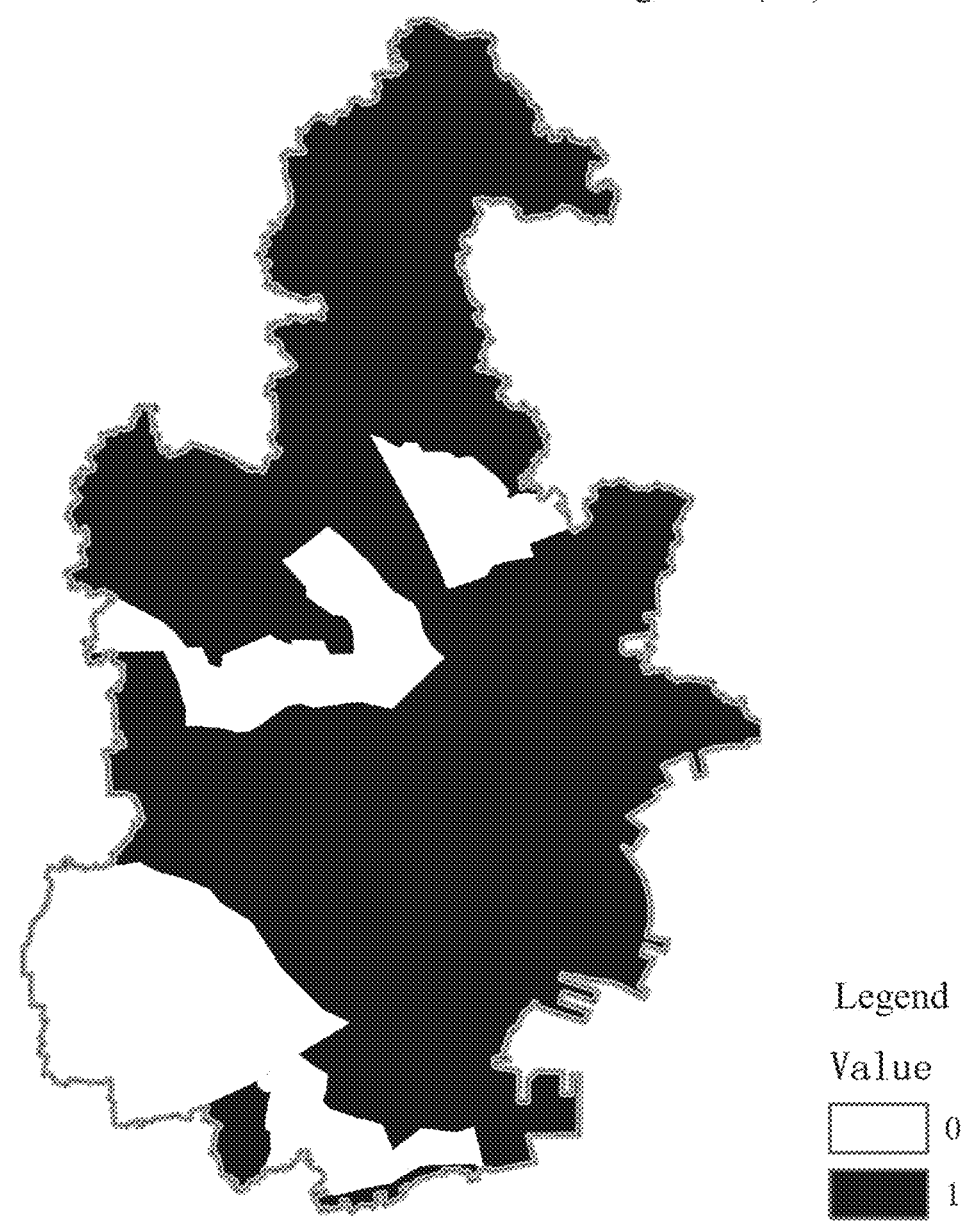
Figure 5F:
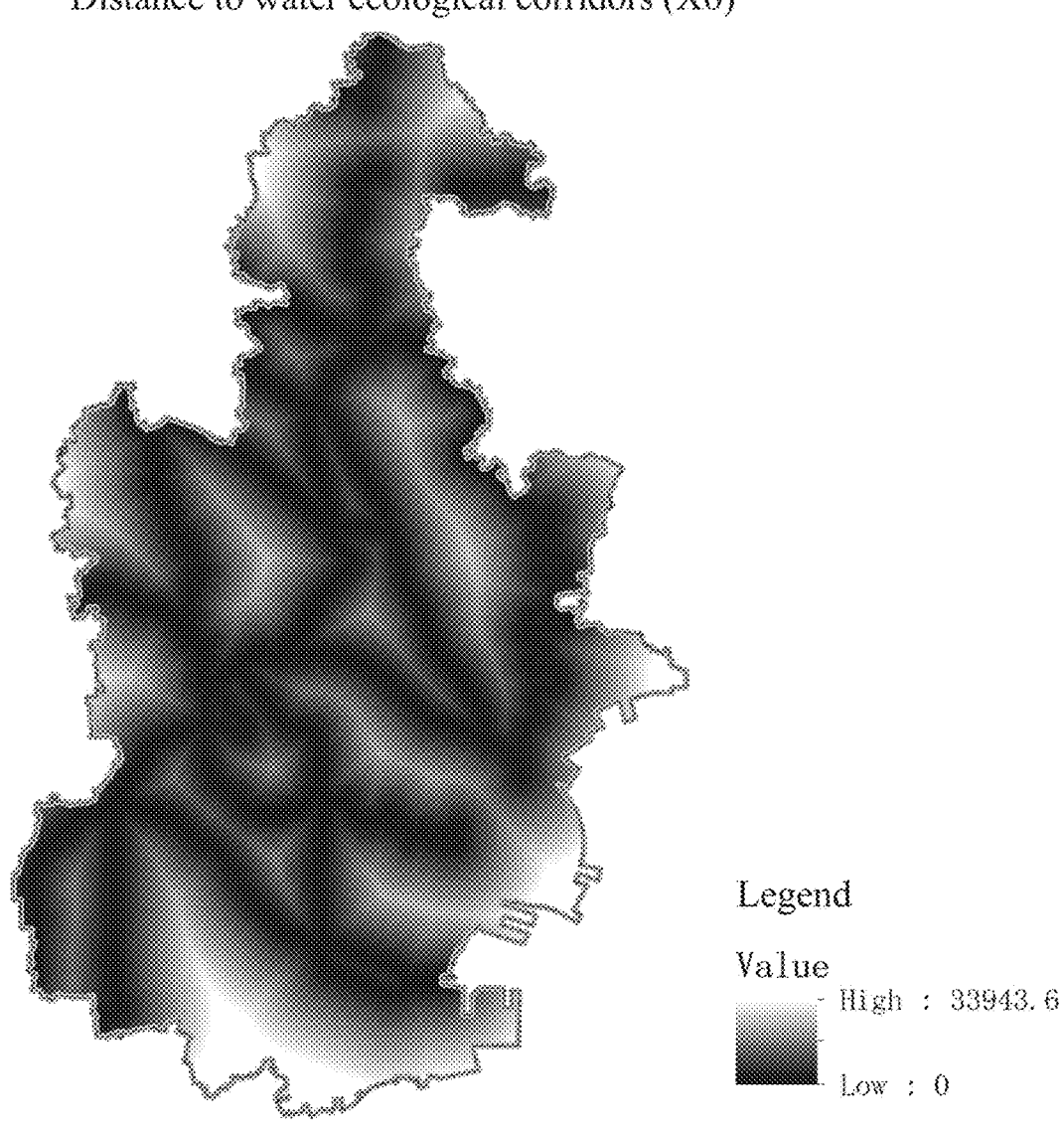
Figure 5G:
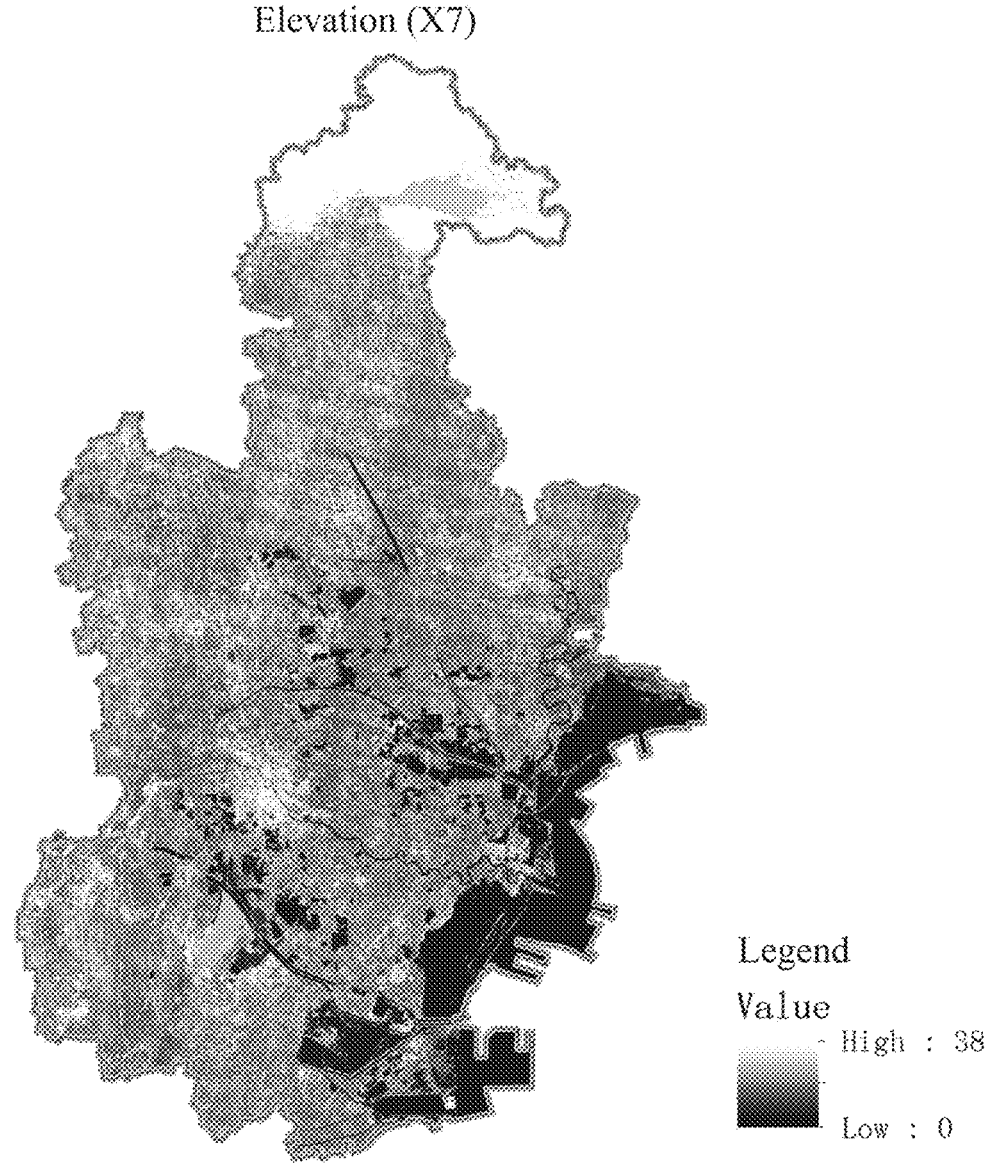
Figure 5H:
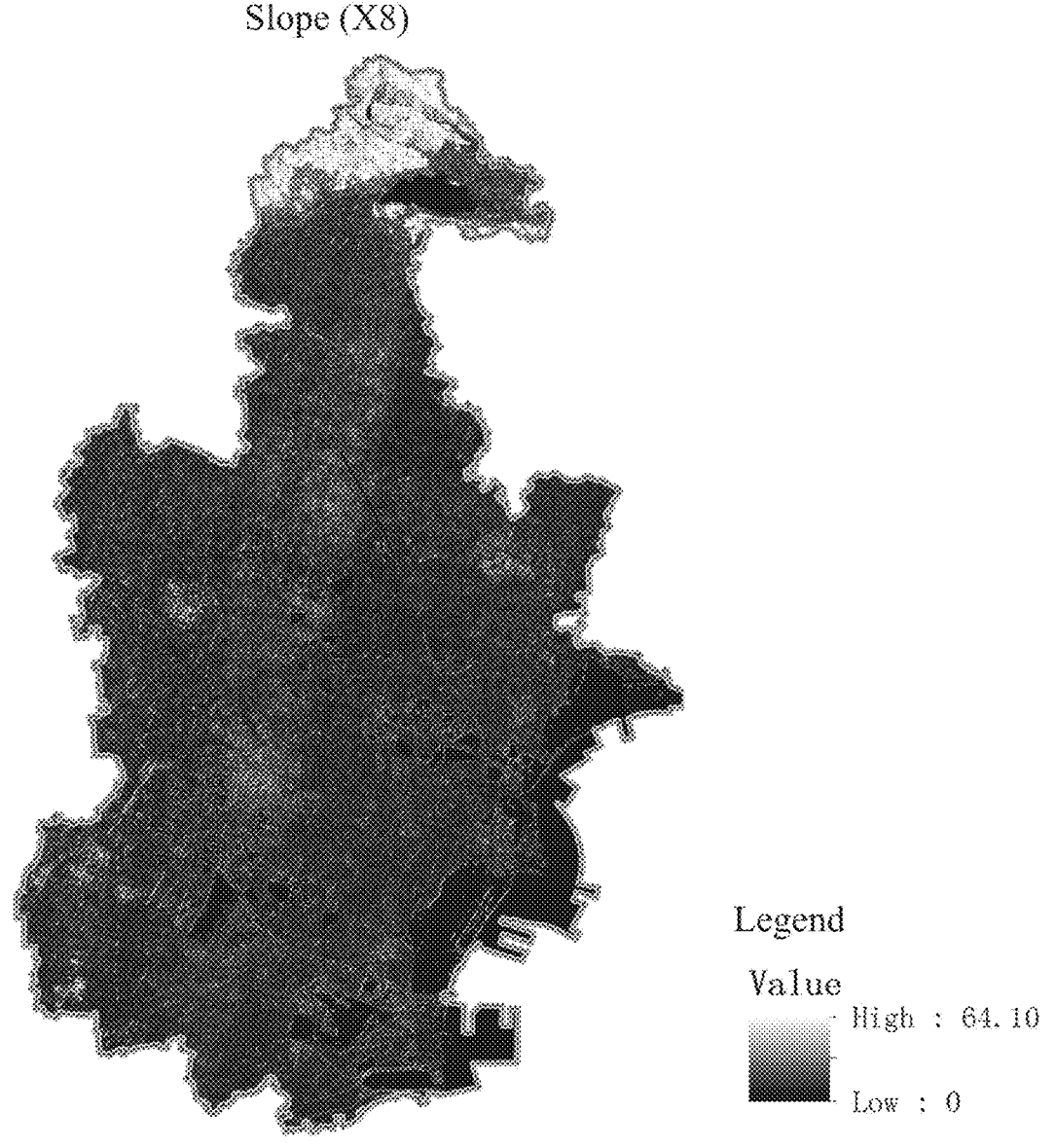
Figure 5I:
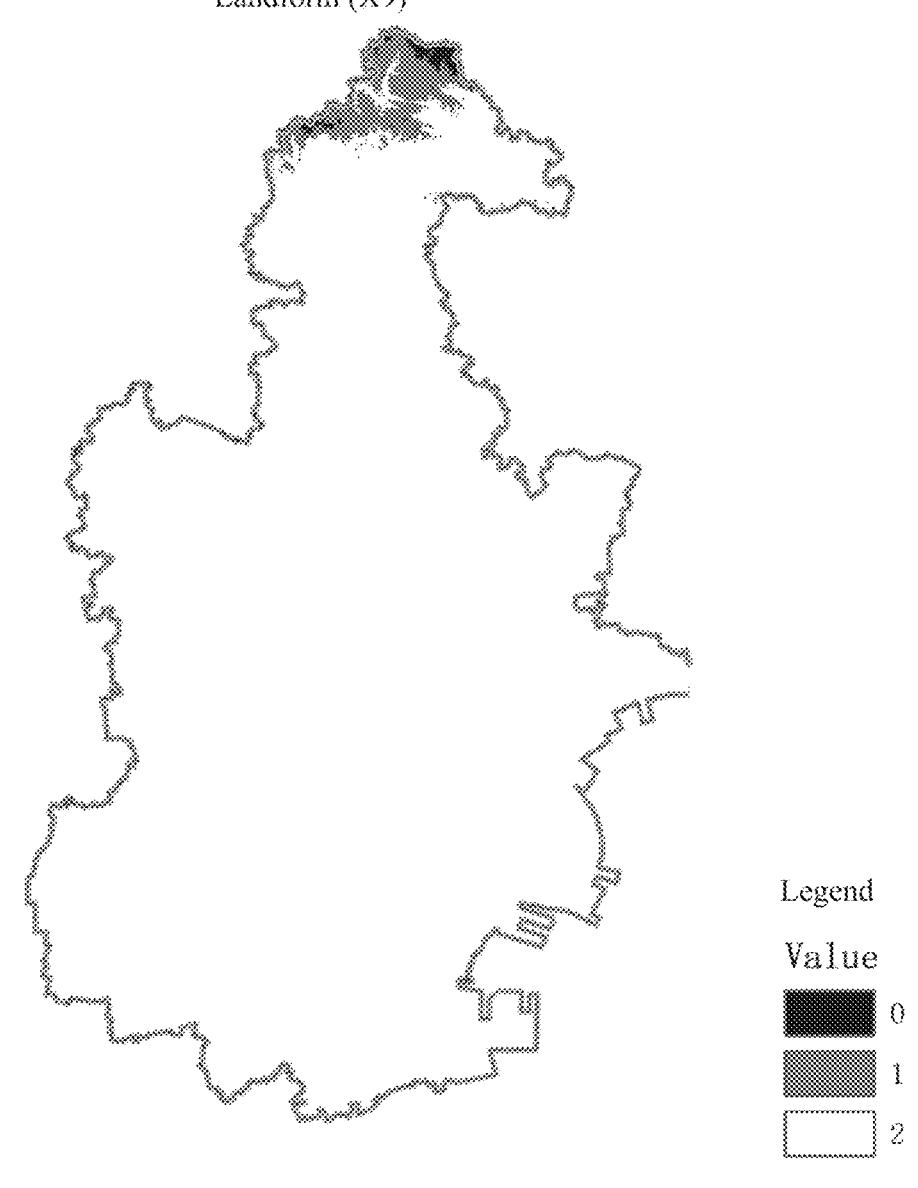
Figure 5J:
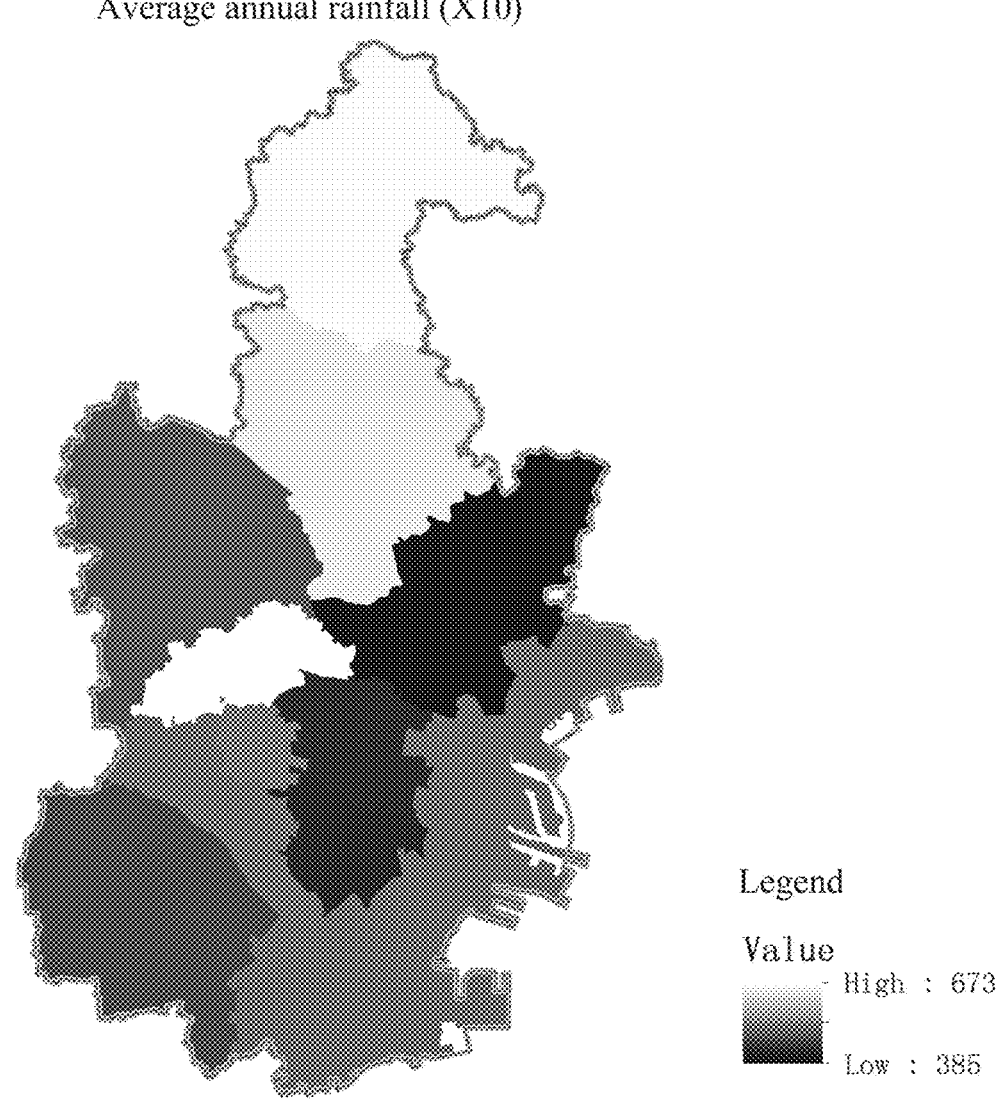
Figure 5K:
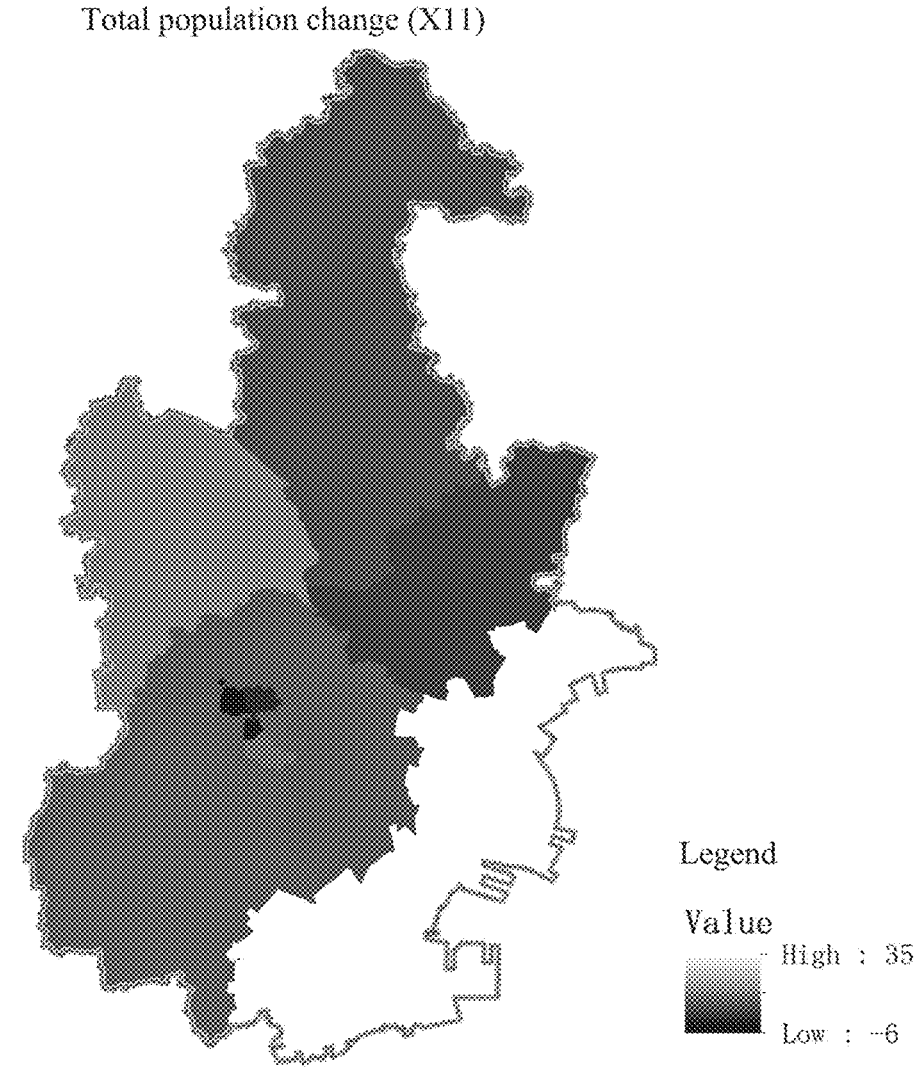
Figure 5L:
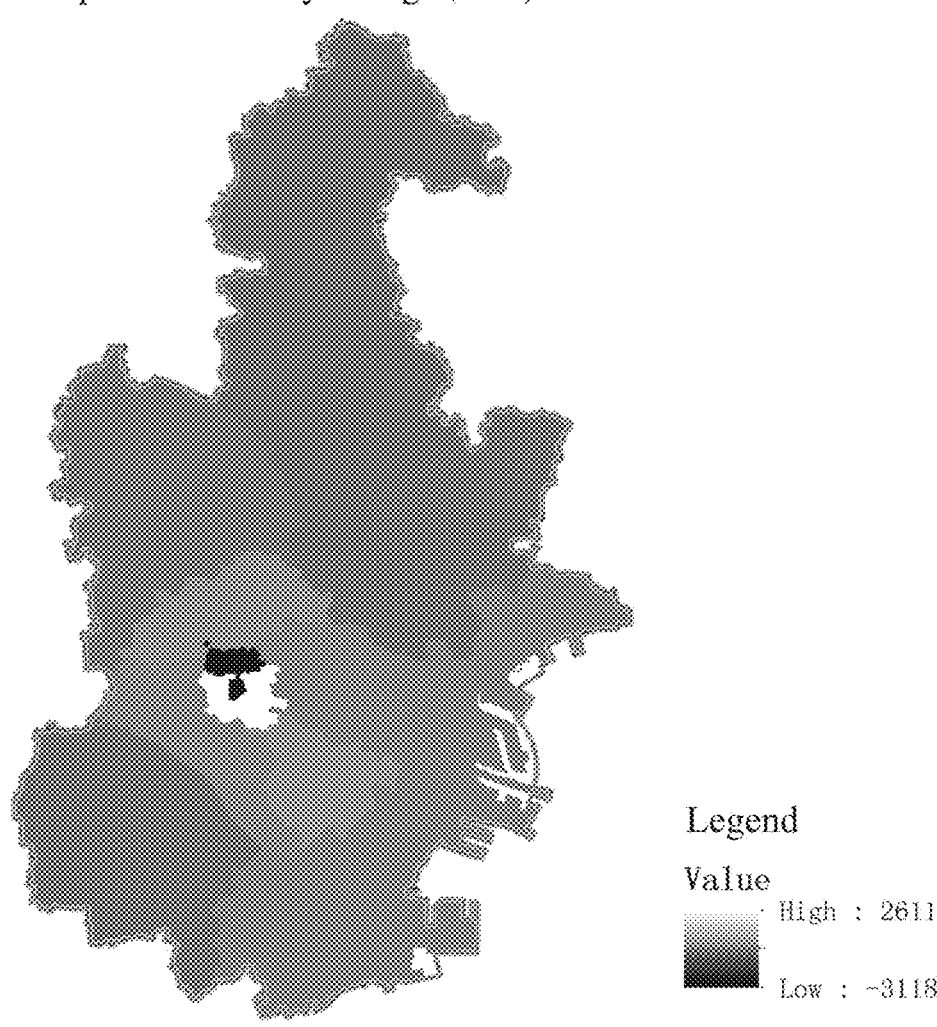
Figure 5M:
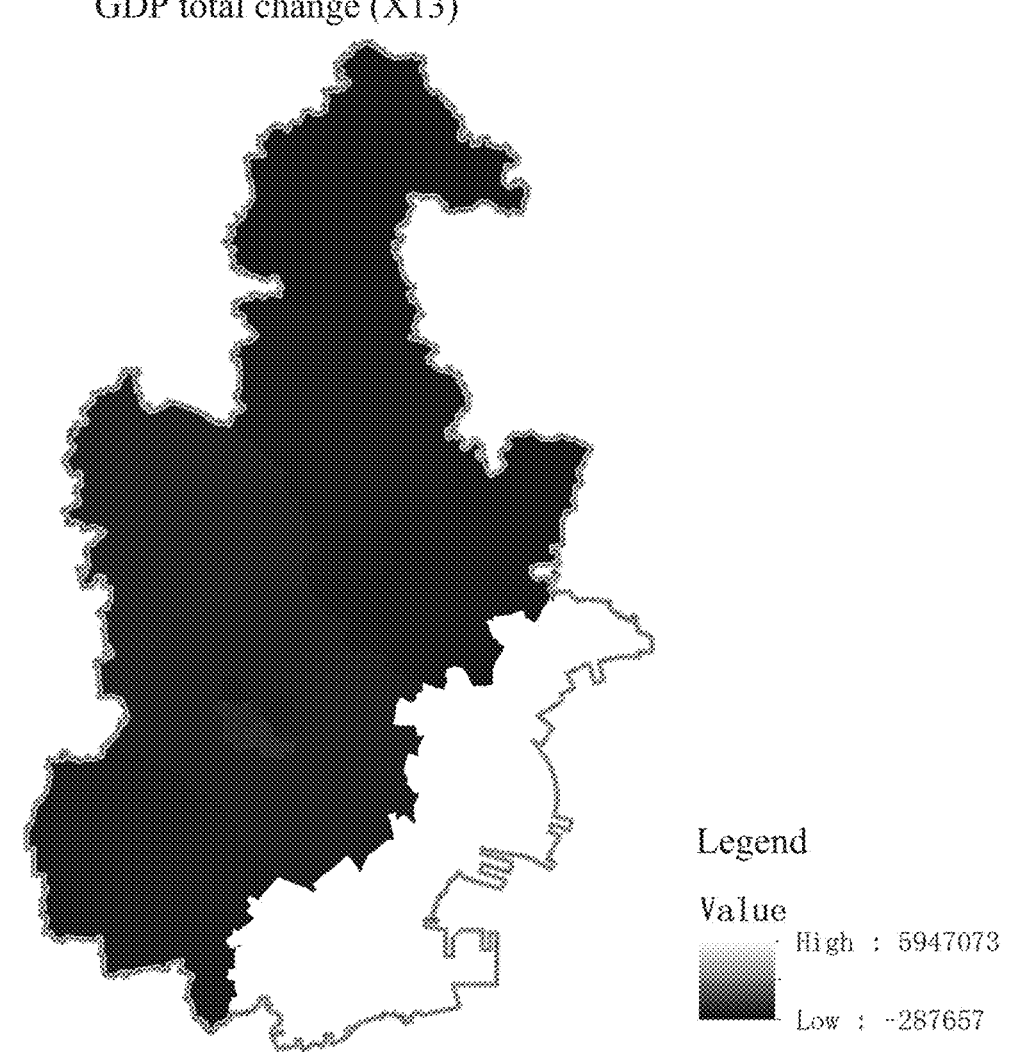
Figure 5N:
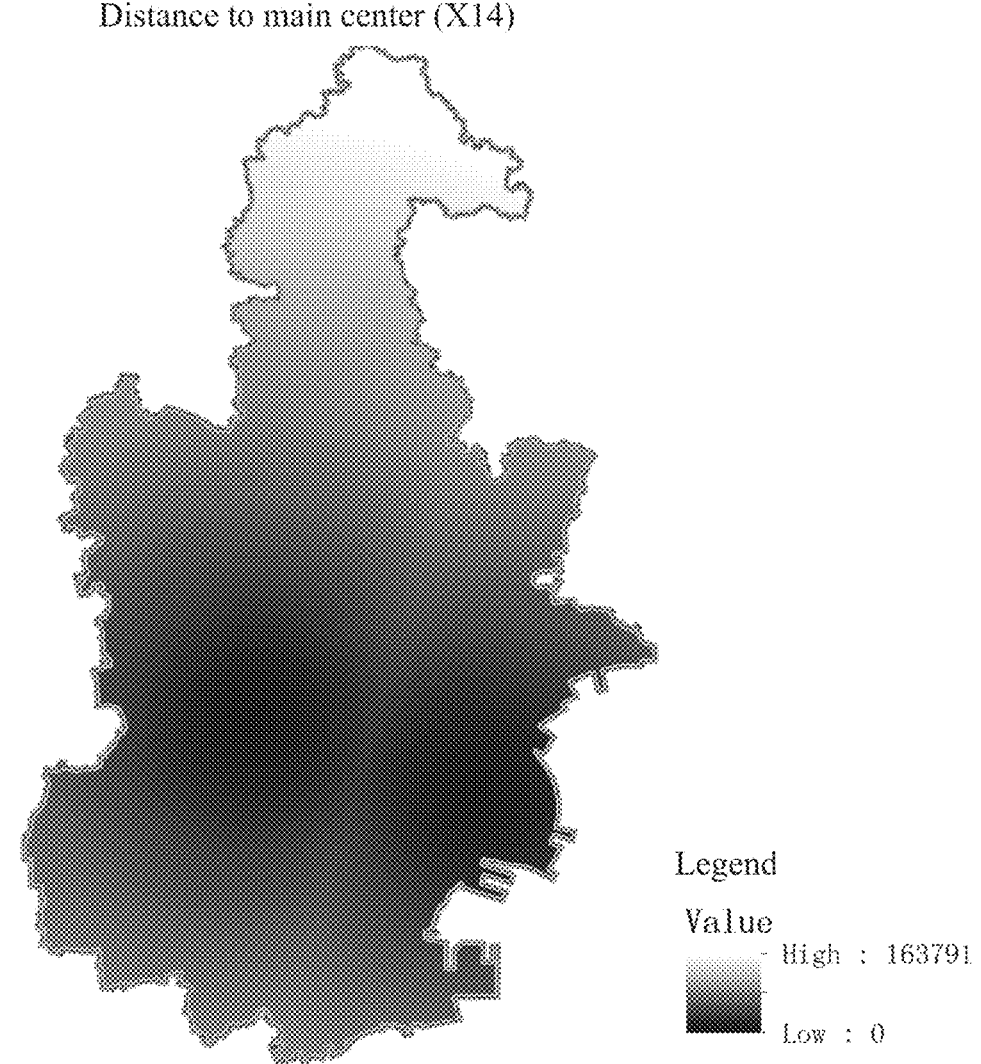
Figure 50:
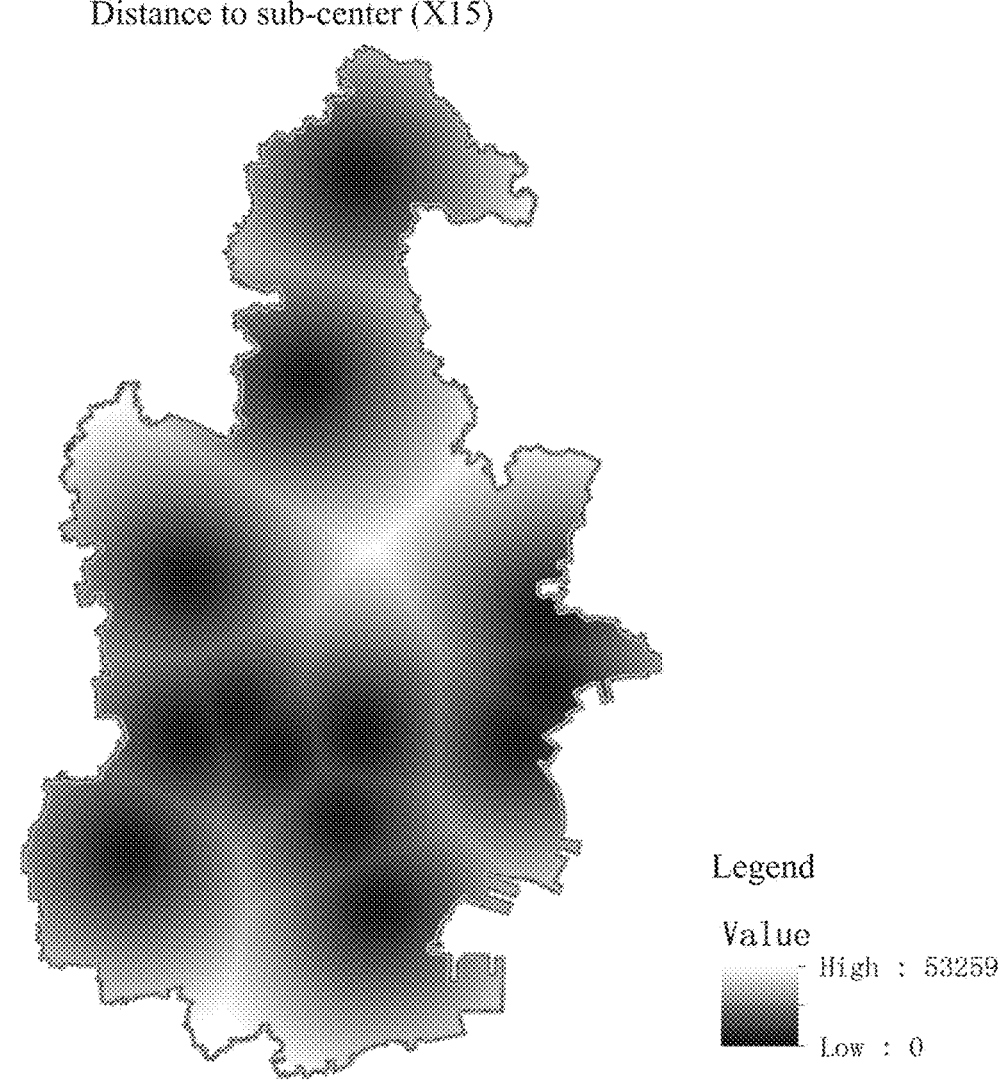
Figure 5P:
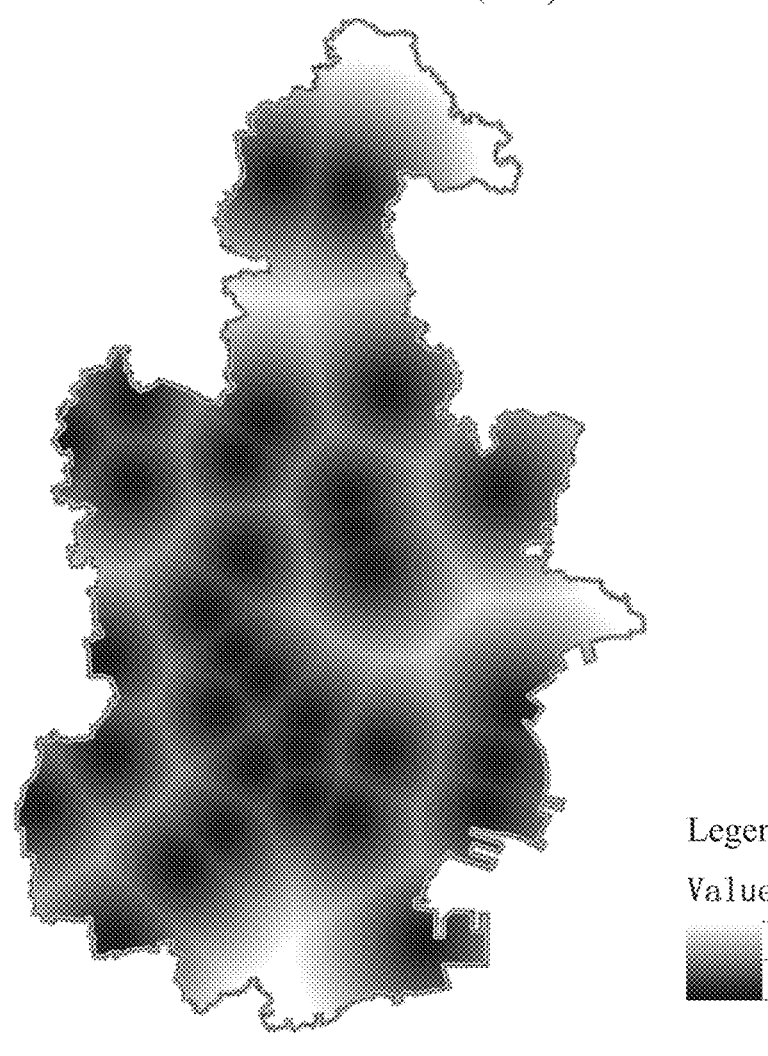
Figure 5Q:
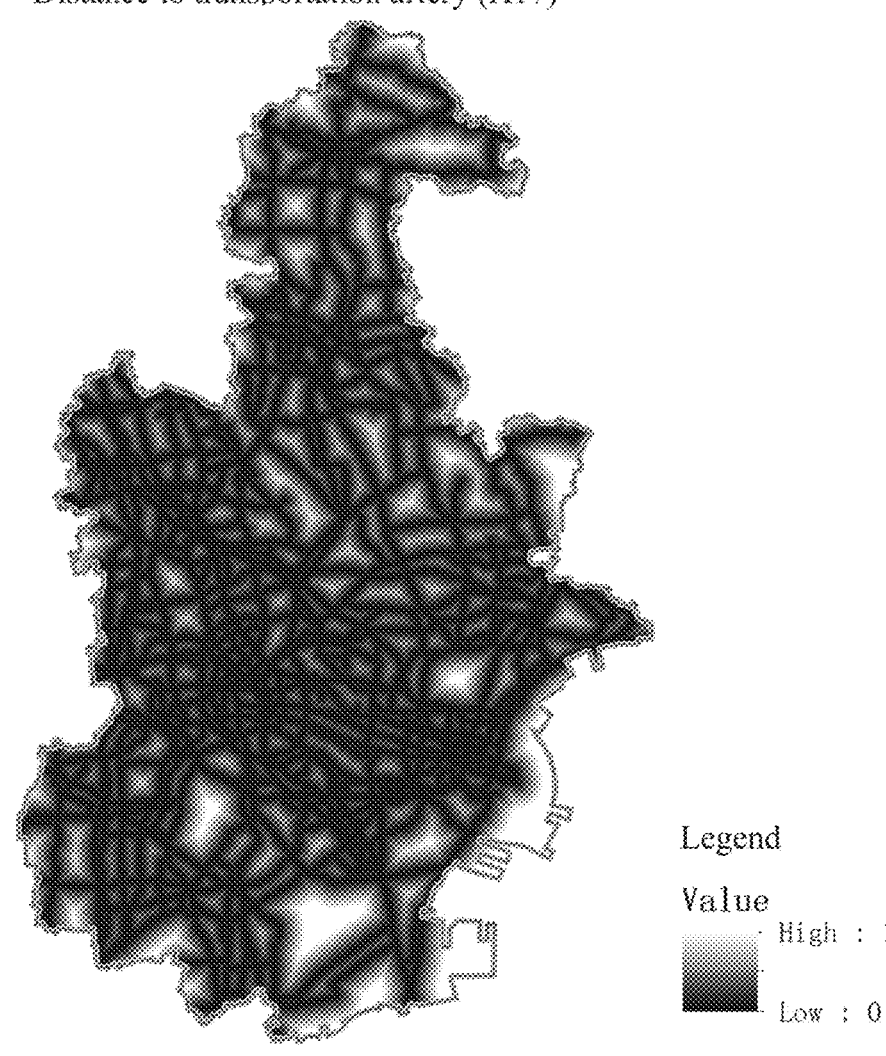
Figure 5R:
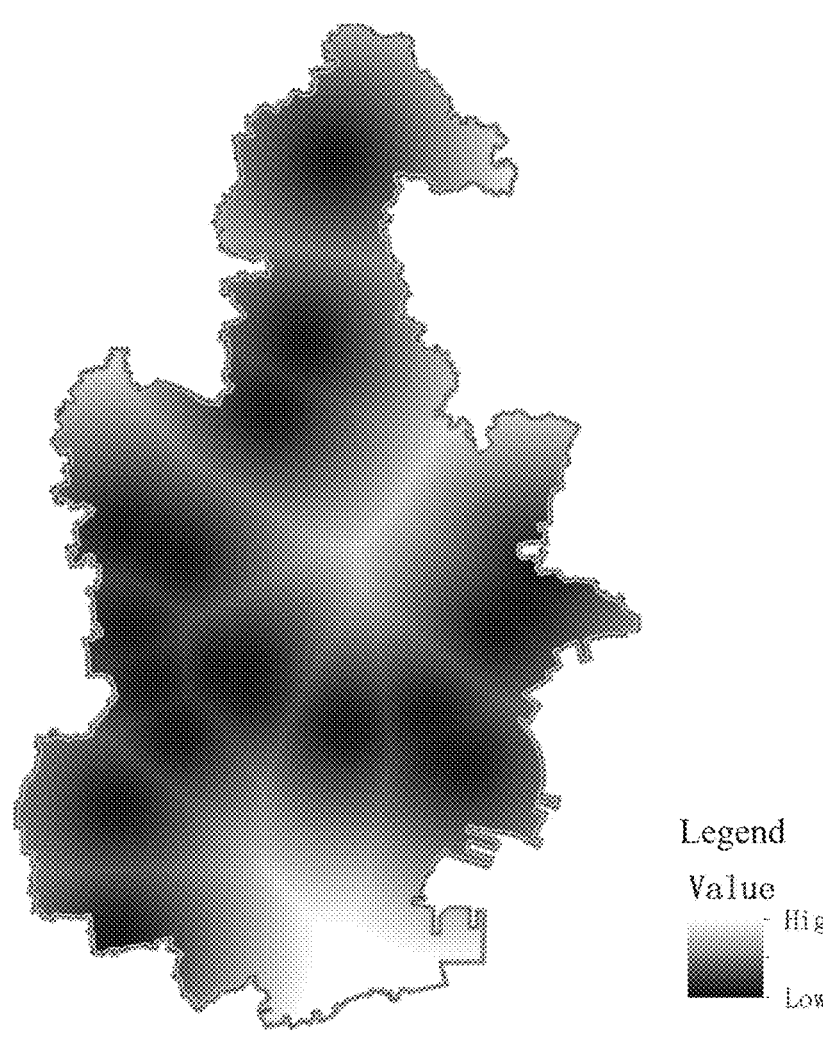
Figure 5S:
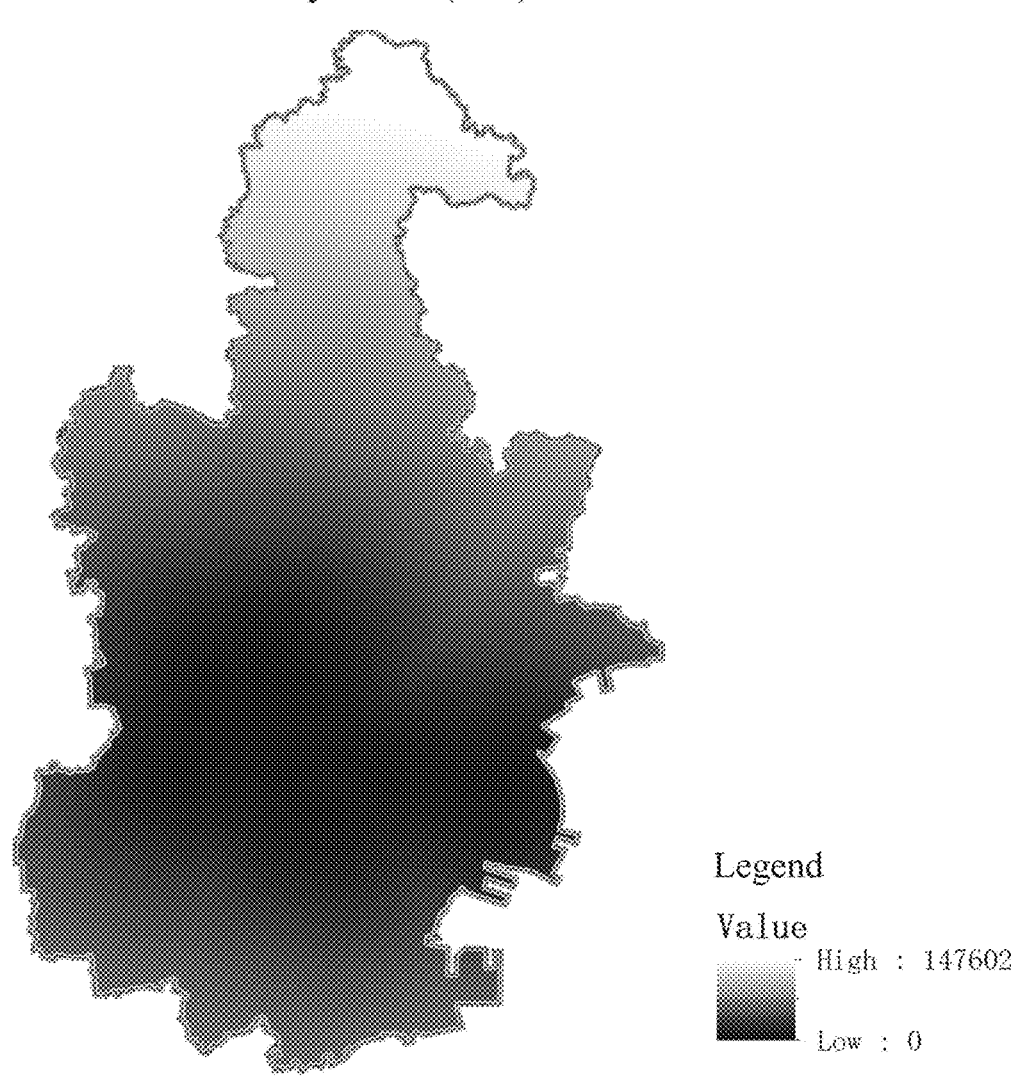
Figure 5T:
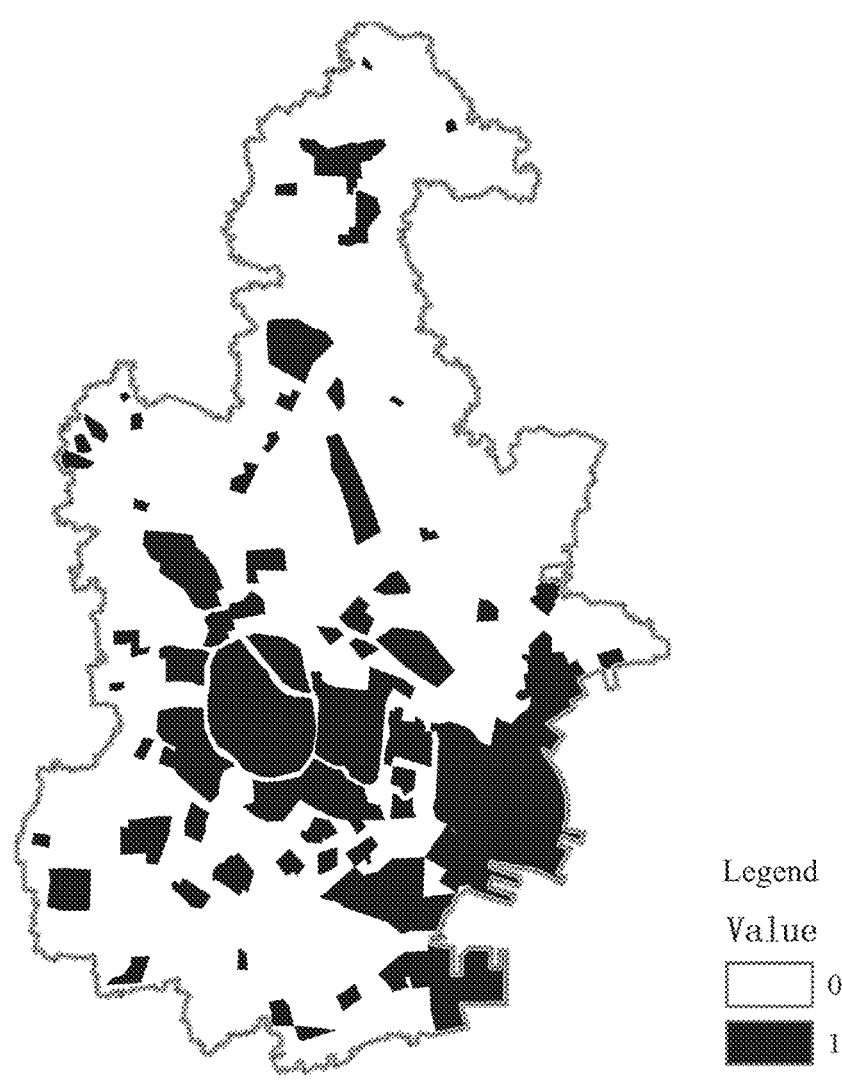
Figure 5U:
Figure 5V:
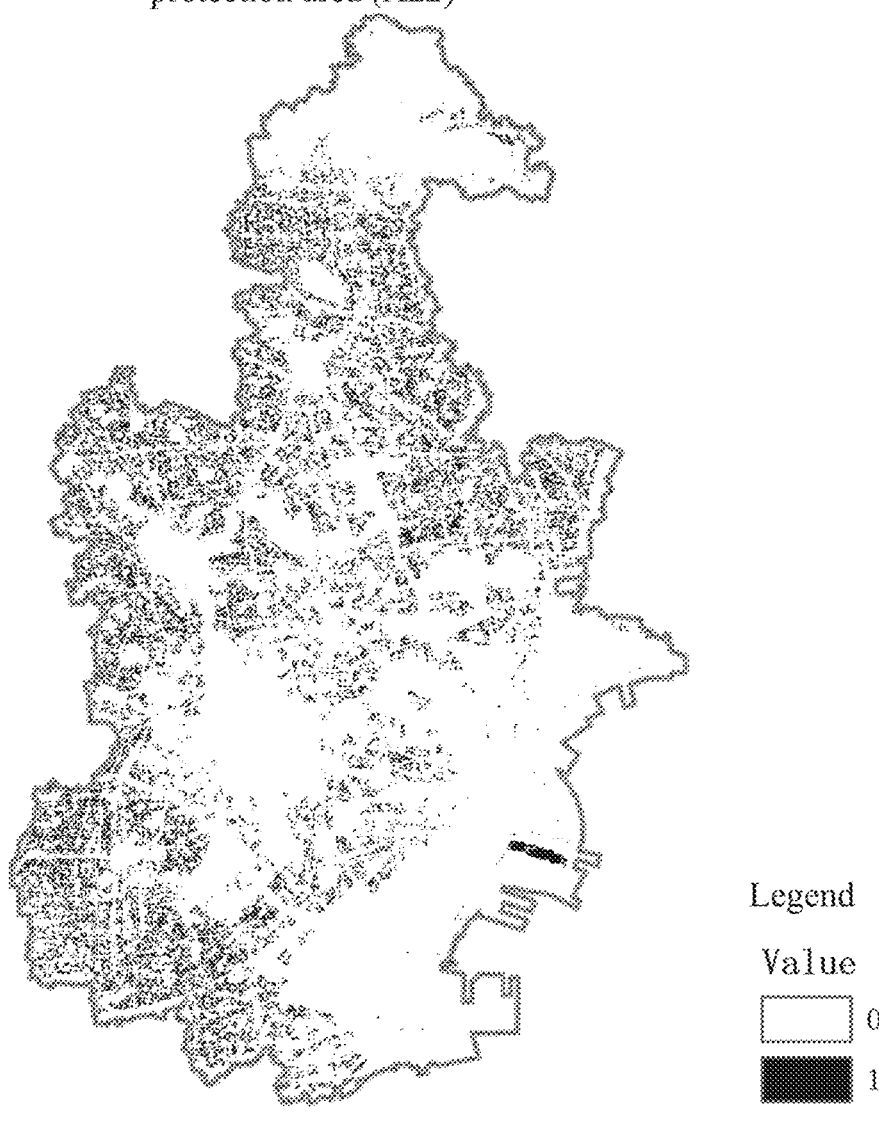
Figure 6A:
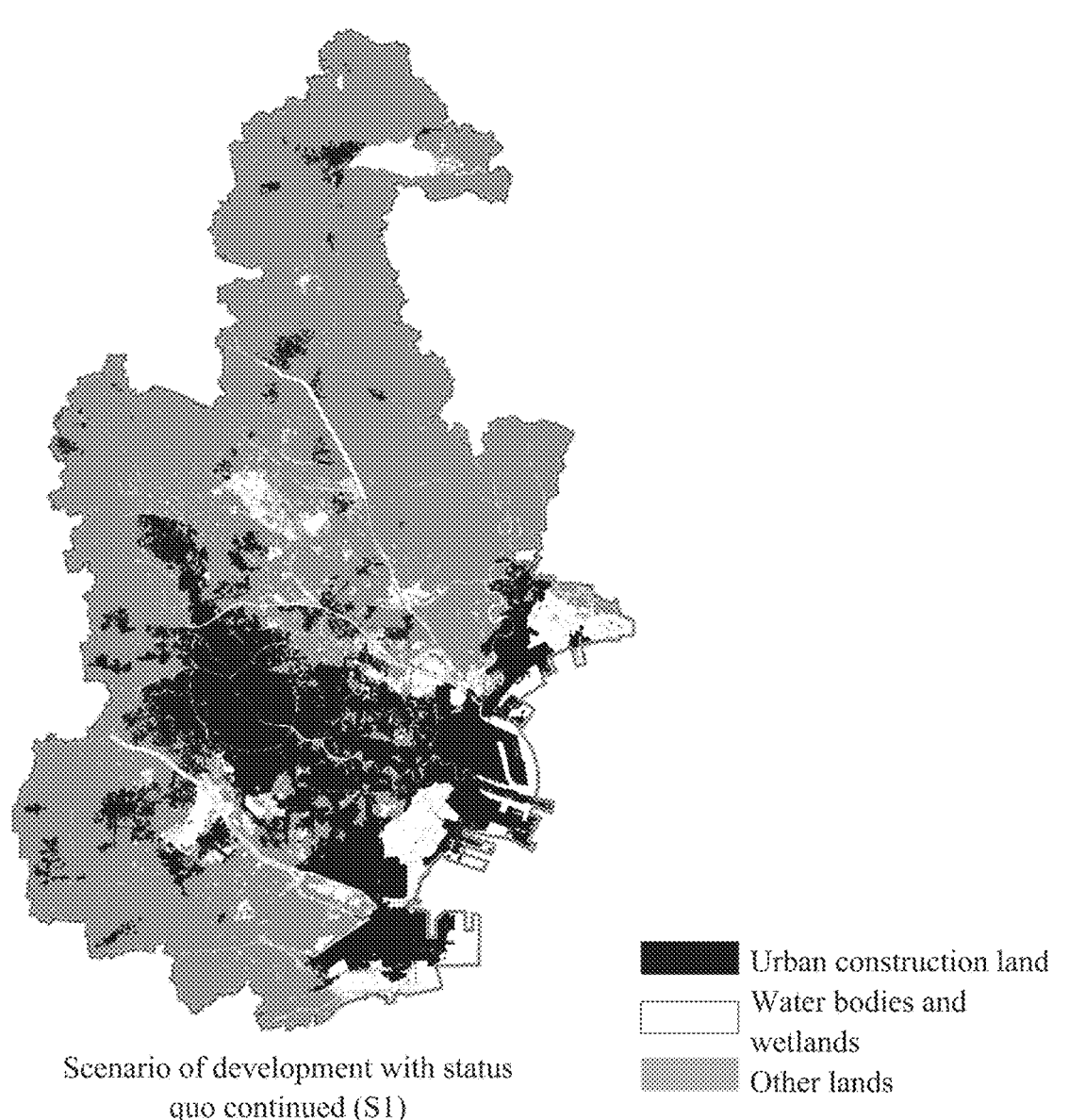
FIGS. 6A-6D illustrate examples of simulation results according to an embodiment of the present disclosure.
Figure 6B:
Figure 6C:
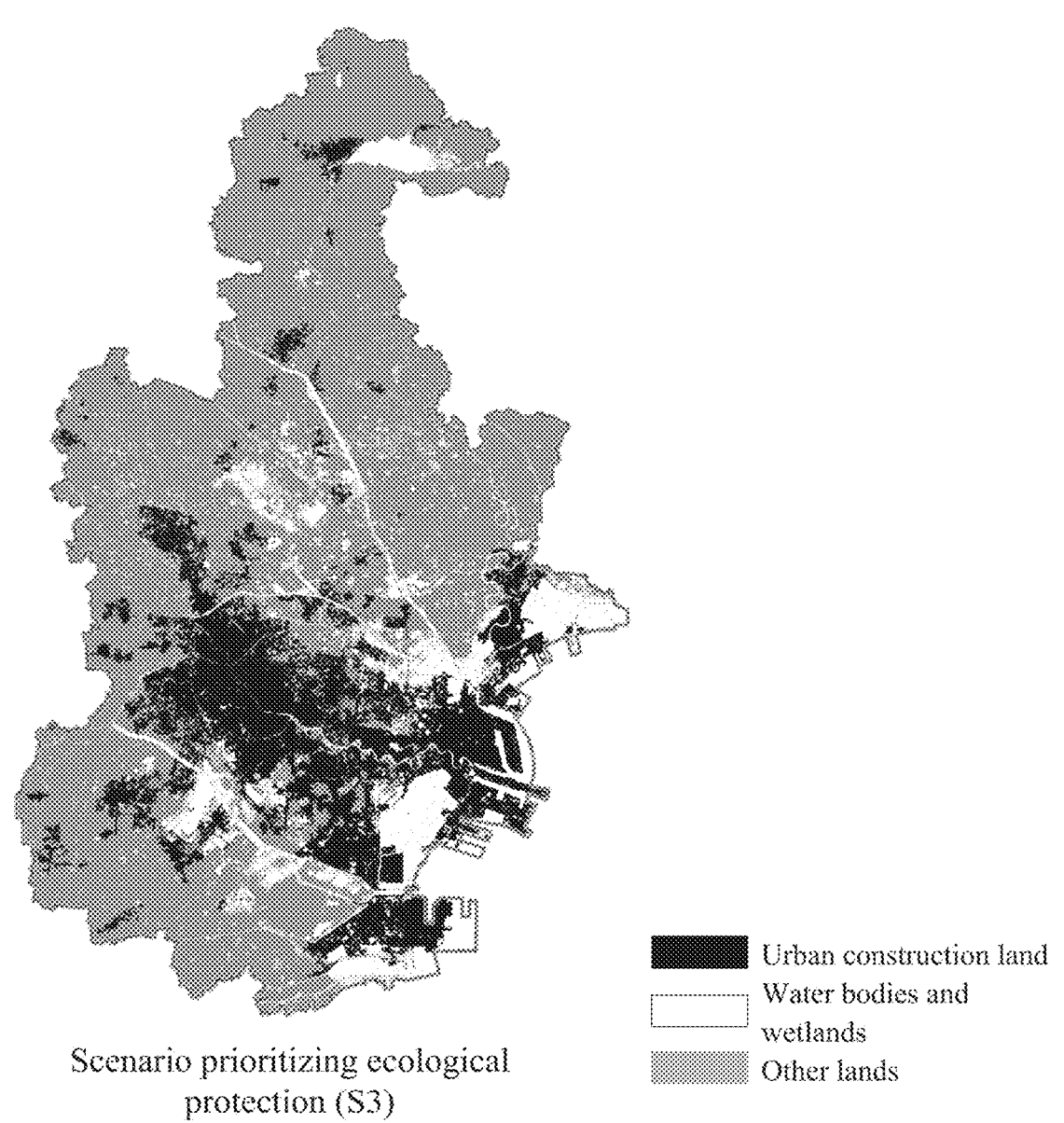
Figure 6D:
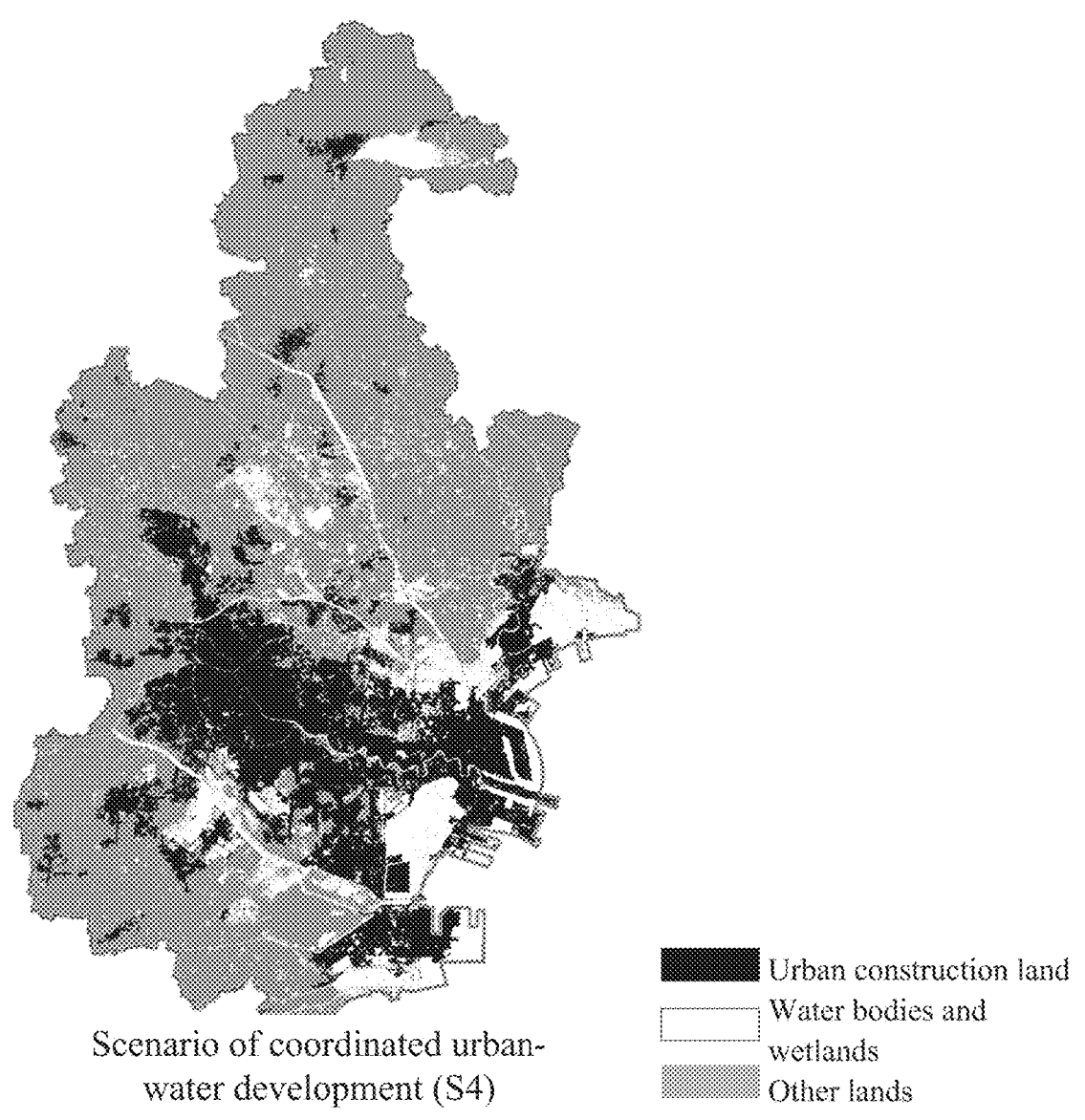

Processing of the data described above includes the following steps:

1) Name data layers and assign values to grid cells based on Table 5 to obtain driving factor layers for land use changes of 22 cities and towns. Exemplary data of the driving factor layers are as shown in FIGS. 5A-5V.

TABLE 5

Driving Factor Layers for Urban Land Use Changes

| Code | Factor name | Data type | Data time |
|------|-------------|-----------|-----------|
| X1 | Distance to Haihe River (m) | Continues | $Y_2$ |
| X2 | Distance to primary rivers (m) | Continues | $Y_2$ |
| X3 | Distance to secondary rivers (m) | Continues | $Y_2$ |
| X4 | Distance to lakes and reservoirs (m) | Continues | $Y_2$ |
| X5 | Whether it is located within a flood storage area (0, 1) | Type | $Y_2$ |
| X6 | Distance to water ecological corridors (m) | Continues | $Y_2$ |
| X7 | Elevation (m) | Continues | $Y_2$ |
| X8 | Slope (degrees) | Continues | $Y_2$ |
| X9 | Landform (0, 1, 2) | Type | $Y_2$ |
| X10 | Average annual rainfall (mm) | Continues | $Y_1, Y_2$ |
| X11 | Total population change (in 10,000 people) | Continues | $Y_1, Y_2$ |
| X12 | Population density change (people/km$^2$) | Continues | $Y_1, Y_2$ |
| X13 | GDP total change (in 10,000 yuan) | Continues | $Y_1, Y_2$ |
| X14 | Distance to main center (m) | Continues | $Y_1, Y_2$ |
| X15 | Distance to sub-center (m) | Continues | $Y_1, Y_2$ |
| X16 | Distance to district-level center (m) | Continues | $Y_1, Y_2$ |
| X17 | Distance to transportation artery (m) | Continues | $Y_1, Y_2$ |
| X18 | Distance to train station (m) | Continues | $Y_1, Y_2$ |
| X19 | Distance to subway station (m) | Continues | $Y_1, Y_2$ |
| X20 | Whether it is planned for construction (0, 1) | Type | $Y_2$ |
| X21 | Whether it is located within the planned | Type | $Y_2$ |

16

TABLE 5-continued

Driving Factor Layers for Urban Land Use Changes

| Code | Factor name | Data type | Data time |
|------|-------------|-----------|-----------|
| X22 | ecological protection area (0, 1) Whether it is located within the basic farmland protection area (0, 1) | Type | $Y_2$ |

2) Calculate spatial autocorrelation factors (Autocov) using the following formula:

$$Autocov_i = \frac{\sum_{i \neq j} W_{ij} y_j}{\sum_{i \neq j} W_{ij}}$$

where $y_j$ represents a land use state of grid cell j, assigned with values of 1 and 0; $W_{ij}$ represents a spatial weight between grid cell i and grid cell j, determined using inverse distance weighting, with a specific calculation method as follows:

$$W_{ij} = \begin{cases} \dfrac{1}{D_{ij}}, & \text{when } D_{ij} < 300 \\ 0, & \text{when } D_{ij} \geq 300 \end{cases}$$

where $D_{ij}$ represents a Euclidean distance (in meters) between grid cell i and grid cell j.

3) Perform a multicollinearity test on driving factors: eliminate factors with multicollinearity using a kappa coefficient and a variance inflation factor (VIF). Factors pass the multicollinearity test when the kappa coefficient is less than 100 and the VIF is less than 10.

4) Reclassify the historical land use raster data, where water bodies and wetlands are assigned with a value of 3, urban construction land is assigned with a value of 2, and other land types are assigned with a value of 1.

5) Run R language programs, with code as follows:

```
#load required packages
library("lulcc")
library("gsubfn")
library('Hmisc')
library('raster')
library('fmsb')
    #load observe maps
data=list(Y1_landuse=raster('fileY1', values=T),
    Y2_landuse=raster('fileY2', values=T))
obs=ObsLulcRasterStack(x=data,
        pattern="lu",
        categories=c(1,2,3),   #set landuse categories
        labels=c("Other","Built","Water"),   #define landuse labels
        t=c(0,10) )   #time steps of observe maps
#load explanatory variables
    expdata=list(X_01=raster('X1.tif',values=T),X_02=raster('X2.tif', values=T),
        X_03=raster('X3.tif',values=T),                 X_04=raster('X4.tif',values=T),
        X_05=raster('X5.tif',values=T),
        X_06=raster('X6.tif',values=T),                 X_07=raster('X7.tif',values=T),
        X_08=raster('X8.tif',values=T),
        X_09=raster('X9.tif',values=T),                 X_10=raster('X10.tif',values=T),
        X_11=raster('X11.tif',values=T),                X_12=raster('X12.tif,values=T),
        X_13=raster('X13.tif',values=T),                X_14=raster('X14.tif',values=T),
        X_15=raster('X15.tif',values=T),                X_16=raster('X16.tif',values=T),
        X_17=raster('X17.tif',values=T),
        X_18=raster('X18.tif',values=T),                X_19=raster('X19.tif',values=T),
        X_20=raster('X20.tif',values=T),                X_21=raster('X21.tif',values=T),
        X_22=raster('X22.tif',values=T),
        Autocov1=raster('Autocov_1.tif',values=T),
```

-continued

```
    Autocov2=raster('Autocov__2.tif',values=T),
    Autocov3=raster(' Autocov__3.tif',values=T))
    ef <- ExpVarRasterList(x=expdata, pattern='X')
    # Autologistic model
    part <- partition(x=obs, size=0.3, spatial=TRUE)
    train.data <- getPredictiveModelInputData(obs=obs, ef=ef, cells=part[["train"]])
    forms<-list(Other            ~           X__01+X__02+X__03+X__04+X__05+X__06+
    X__07+X__08+X__09+X__10+X__11+X__12+X__13+
    X__14+X__15+X__16+X__17+X__18+X__19+X__20+X__21+X__22+ Autocov1,
        Built
~ X__01+X__02+X__03+X__04+X__05+X__06+   X__07+X__08+X__09+X__10+X__11+X__12+X__13+
X__14+X__15+X__16+X__17+X__18+X__19+X__20+X__21+X__22+ Autocov2,
    Water ~ X__01+X__02+X__03+X__04+X__05+X__06+ X__07+X__08+X__09+X__10+X__11
    +X__12+X__13+ X__14+X__15+X__16+X__17+X__18+X__19+X__20+X__21+X__22+Autoco
    v3)
    glm.models<-glmModels(formula=forms,family=binomial(link='logit'),data=train.data,
        obs=obs,control=list(maxit=100))
    summary(glm.models)
    # test ability of models to predict allocation of other, built and water
    test.data <- getPredictiveModelInputData(obs=obs, ef=ef, cells=part[["test"]])
    glm.pred <- PredictionList(models=glm.models, newdata=test.data)
    glm.perf <- PerformanceList(pred=glm.pred, measure="tpr", x.measure="fpr")
    plot(list(glm.perf)) # ROC curve
    # obtain demand scenario
    dmd <- approxExtrapDemand(obs=obs, tout=0:18) # for testing the model, use t
    his code. tout is predict time
    dmd <- read.csv('demand.csv', header=T) # for prediction use this code
    # get neighbourhood values
    w <- matrix(data=1, nrow=3, ncol=3)
    nb <- NeighbRasterStack(x=obs[[1]], weights=w, categories=c(2))
    # load mask
    mask <- raster('mask.shp', values=T)
    #set clues.rules
    clues.rules <- matrix(data=c(1,1,1,1,1,1,1,1,1), nrow=3, ncol=3, byrow=TRUE)
    #create CLUE-S model object
    clues.parms <- list(jitter.f=0.000007,
            scale.f=0.00000007,
            max.iter=3000,
            max.diff=100,
    ave.diff=100)
    clues.model <- CluesModel(obs=obs,
            ef=ef,
            models=glm.models,
            time=0:18,
            demand=dmd,
          mask=mask,
            neighb=nb,
            elas=c(0.87, 0.91, 0.76),
            rules=clues.rules,
            params=clues.parms)
    clues.model@nb.rules=c(0.3)
    #perform allocation
    clues.model <- allocate(clues.model)
    summary(clues.model)
    #Kappa test
    points <- rasterToPoints(obs[[1]], spatial=TRUE)
    pred__map=extract(clues.model@output[[11]],__points) #predicted landuse map of Y
    2
    obs__map=extract(Y2__landuse, points) #observed landuse map of Y2
    res <- Kappa.test(x=pred__map, y=obs__map, conf.level=0.95)
    str(res)
    print(res)
```

Table 6 below shows parameters of the simulation module for urban land use change and explanations thereof.

TABLE 6

| Parameter | Explanations |
| --- | --- |
| obs | Land use type map in the format of ObsLulcRasterStack, containing observation data of at least two time points |
| ef | Driving factor raster map in the format of ExpVarRasterList, used to predict spatial features of different land use types |
| models | Prediction model of a spatial feature module, buiding an Autologistic regression model using the glmModels statement |
| time | Numeric vector format defining the simulation duration |

TABLE 6-continued

| Parameter | | Explanations |
|---|---|---|
| demand | | Land demand matrix |
| | hist | Historical map of land use types, where a grid cell value represents the duration (in years) in which the grid cell is in the current land type |
| | mask | Module for land policies and restricted areas, in the format of a binary value raster layer where a grid cell with a value of 0 indicates that the land use type cannot be changed. |
| | neighb | Defining the range of neighborhood influence |
| | elas | Land transfer elasticity, with a value between 0 and 1, where values closer to 0 indicate low transfer elasticity and values closer to 1 indicate high transfer elasticity |
| | rules | Land transfer order, in the format of a numeric matrix |
| | nb.rules | Threshold for neighborhood influence, with a value between 0 and 1, where land use types can change when the value exceeds this threshold |
| params | jitter.f | Initial disturbance factor, which sets the random disturbance level for land demand allocation before the spatial allocation loop, where a higher value indicates a larger initial disturbance. The default value is 0.0001. |
| | scale.f | Increment factor. When the allocated area is different from the land demand area and land demand needs to be redistributed, the number of iteration variables $IR_u$ is increased or decreased. The default value is 0.005. |
| | max.iter | Maximum number of iterations |
| | max.diff | Maximum difference, indicating a maximum allowable difference between the allocated area and the land demand area. The default value is 5. |
| | ave.diff | Average difference, indicating an average allowable difference between the allocated area and the land demand area. The default value is 5. |
| | output | Output data format, which is raster file or Null (empty) |

6) Output simulation results, which are stored as a tiff format file, where FIGS. 6A-6D show an example of the simulation results.

The principle of the present disclosure is as follows: The simulation system simulates urban spatial growth under different urban development and water resource and environmental protection conditions by coupling interactions between water resource supply, water environmental protection, as well as water ecological security and urban population, urban industry, as well as scale and spatial layout of urban land, to assist in delineating urban development boundaries and formulating relevant control policies for urban spatial growth.

The basic principles, main features, and advantages of the present disclosure are shown and described above. Various changes and modifications may be made to the present disclosure without departing from the spirit and scope of the present disclosure. Such changes and modifications all fall within the claimed scope of the present disclosure.

What is claimed is:

1. A method for simulating urban spatial growth by coupling urban development with water resources environmental carrying capacity, comprising:

step of dynamic evaluation for a water resources carrying capacity to evaluate and predict a maximum scale of an urban space;

step of identification for a water ecological sensitive area to identify water ecological security patterns and determine-spatial regions that need to be avoided during urban spatial growth; and step of simulation for urban land use change to predict spatial layout features of urban land under different water ecological sensitive area protection modes and urban spatial growth scales;

wherein the step of simulation for urban land use change comprises:

executing an urban land use change simulation model to establish a simulation model for urban land use changes based on historical land use change patterns; and executing an urban land use change scenario simulation to simulate and predict urban land use changes under different scenarios of water resources environmental protection and development, to generate simulation results for urban spatial growth coupled with water resources environmental carrying capacity;

wherein the simulation for urban land use change further comprising steps:

1) name data layers and assign values to grid cells based on data material categories to obtain driving factor layers for urban land use changes;

2) calculate spatial autocorrelation factors (Autocov) using the following formula:

$$Autocov_i = \frac{\sum_{i \neq j} W_{ij} y_j}{\sum_{i \neq j} W_{ij}}$$

wherein $y_j$ represents a land use state of grid cell j, assigned with values of 1 and 0; $W_{ij}$ represents a spatial weight between grid cell i and grid cell j, determined using inverse distance weighting, with a specific calculation method as follows:

$$W_{ij} = \begin{cases} \dfrac{1}{D_{ij}}, & \text{when } D_{ij} < 300 \\ 0, & \text{when } D_{ij} \geq 300 \end{cases}$$

wherein $D_{ij}$ represents a Euclidean distance between grid cell i and grid cell j;

3) perform a multicollinearity test on driving factors;

4) reclassify the historical land use raster data;

5) run R language programs; and 6) output simulation results;

the step of dynamic evaluation for a water resources carrying capacity comprising steps:

simulate and quantify supply capacity of various conventional and unconventional water resources in a region where a city is located;

simulate and quantify water resource demand of urban and rural areas;

simulate and quantify a feedback process of improving environmental water quality and reducing pollutant emissions under water pollution pressure;

simulate and quantify a feedback process of improving water resource utilization efficiency under water supply pressure; and simulate and quantify impact of urban development on water supply-demand balance and water pollution pressure; and the step of identification for a water ecological sensitive area comprises a step for water ecological security pattern construction to form a spatial pattern composed of local areas, points, and spatial relationships that play a key role in maintaining ecological security; and to extract important spatial regions that protect the health of water ecological environments.

2. The method according to claim 1, wherein the step of identification for a water ecological sensitive area is specifically configured to establish spatial data layers of water ecological source areas, evaluate resistance surfaces to obtain resistance surface data layers, extract water ecological corridors to obtain water ecological corridor data layers, and divide importance levels of the water ecological security patterns.

3. The method according to claim 1, wherein in 3), factors with multicollinearity are eliminated using a kappa coefficient and a variance inflation factor (VIF); and factors pass the multicollinearity test when the kappa coefficient is less than 100 and the VIF is less than 10.

4. The method according to claim 3, wherein in 4), water bodies and wetlands are assigned with a value of 3, urban construction land is assigned with a value of 2, and other land types are assigned with a value of 1.

* * * * *